United States Patent
Almogy et al.

(10) Patent No.: US 8,686,279 B2
(45) Date of Patent: Apr. 1, 2014

(54) CONCENTRATING SOLAR ENERGY COLLECTOR

(75) Inventors: Gilad Almogy, Palo Alto, CA (US); Ratson Morad, Palo Alto, CA (US); Amir Bar, Sunnyvale, CA (US); Amir Arie Weiss, Sunnyvale, CA (US); Ofer Ricklis, Kfar-Sava (IL); Andrey Bochkariov, Rosh Ha'ayin (IL)

(73) Assignee: Cogenra Solar, Inc., Mountain View, CA (US)

( * ) Notice: Subject to any disclaimer, the term of this patent is extended or adjusted under 35 U.S.C. 154(b) by 775 days.

(21) Appl. No.: 12/781,706

(22) Filed: May 17, 2010

(65) Prior Publication Data
US 2011/0279918 A1     Nov. 17, 2011

(51) Int. Cl.
*H01L 31/052*     (2006.01)

(52) U.S. Cl.
USPC ............................ 136/246; 126/694; 126/696

(58) Field of Classification Search
USPC ........... 126/684–696; 136/246; 359/851–853, 359/872
See application file for complete search history.

(56) References Cited

U.S. PATENT DOCUMENTS

| | | |
|---|---|---|
| 3,490,950 A | 1/1970 | Myer |
| 3,769,091 A | 10/1973 | Leinkram et al. |
| 3,988,166 A | 10/1976 | Beam |
| 4,002,031 A | 1/1977 | Bell |
| 4,038,971 A | 8/1977 | Bezborodko |
| 4,075,420 A | 2/1978 | Walton |
| 4,078,544 A | 3/1978 | Hollands et al. |
| 4,097,309 A | 6/1978 | Horne |
| 4,178,913 A | 12/1979 | Hutchison |
| 4,180,414 A | 12/1979 | Diamond et al. |
| 4,243,019 A | 1/1981 | Severson |
| 4,249,514 A | 2/1981 | Jones |
| 4,281,900 A | 8/1981 | Lewis, Jr. |
| 4,296,737 A | 10/1981 | Silk |
| 4,332,238 A | 6/1982 | Garcia, Jr. |
| 4,337,758 A | 7/1982 | Meinel et al. |
| 4,351,319 A | 9/1982 | Robbins, Jr. |
| 4,361,717 A | 11/1982 | Gilmore et al. |
| 4,386,600 A | 6/1983 | Eggert, Jr. |

(Continued)

FOREIGN PATENT DOCUMENTS

| | | |
|---|---|---|
| DE | 20 2011 103 199 U1 | 2/2012 |
| WO | WO 99-42765 | 8/1999 |

(Continued)

OTHER PUBLICATIONS

PCT/US2010/036220 International Search Report and Written Opinion mailing date Jun. 20, 2011; 12 pp.

(Continued)

*Primary Examiner* — Jennifer L Doak
*Assistant Examiner* — James McGee
(74) *Attorney, Agent, or Firm* — K&L Gates LLP

(57) ABSTRACT

A concentrating solar energy collector comprises a linearly extending receiver comprising solar cells, a plurality of linearly extending reflective elements arranged in side-by-side rows, oriented parallel to a long axis of the receiver, and fixed in position with respect to each other and with respect to the receiver to form a linearly extending reflector, and a linearly extending support structure supporting the receiver and the reflector and pivotally mounted to accommodate rotation of the support structure, the reflector, and the receiver about a rotation axis parallel to the long axis of the receiver.

23 Claims, 14 Drawing Sheets

(56) References Cited

U.S. PATENT DOCUMENTS

| | | | |
|---|---|---|---|
| 4,388,481 A | 6/1983 | Uroshevich | |
| 4,422,443 A | 12/1983 | Arendt | |
| 4,422,893 A | 12/1983 | Duchateau et al. | |
| 4,427,838 A | 1/1984 | Goldman | |
| 4,435,043 A | 3/1984 | Mertens et al. | |
| 4,454,371 A * | 6/1984 | Folino | 136/246 |
| 4,719,904 A | 1/1988 | O'Neill | |
| 4,771,764 A | 9/1988 | Cluff | |
| 4,846,151 A | 7/1989 | Simko, Jr. | |
| 4,877,959 A | 10/1989 | Page | |
| 5,054,466 A | 10/1991 | White et al. | |
| 5,191,876 A | 3/1993 | Atchley | |
| 5,232,519 A | 8/1993 | Glatfelter et al. | |
| 5,253,637 A | 10/1993 | Maiden | |
| 5,344,497 A | 9/1994 | Fraas et al. | |
| 5,401,329 A | 3/1995 | Fraas et al. | |
| 5,498,297 A | 3/1996 | O'Neill et al. | |
| 5,505,789 A | 4/1996 | Fraas et al. | |
| 5,505,917 A | 4/1996 | Collier, Jr. | |
| 5,542,409 A | 8/1996 | Sampayo | |
| 5,616,185 A | 4/1997 | Kukulka | |
| 5,994,641 A | 11/1999 | Kardauskas | |
| 6,020,555 A | 2/2000 | Garboushian et al. | |
| 6,080,927 A | 6/2000 | Johnson | |
| 6,082,353 A | 7/2000 | Van Doorn et al. | |
| 6,123,067 A | 9/2000 | Warrick | |
| 6,218,605 B1 | 4/2001 | Daily et al. | |
| 6,232,545 B1 | 5/2001 | Samaras et al. | |
| 6,276,359 B1 | 8/2001 | Frazier | |
| 6,303,853 B1 | 10/2001 | Fraas et al. | |
| 6,946,081 B2 | 9/2005 | Voutchkov | |
| 7,388,146 B2 | 6/2008 | Fraas et al. | |
| 7,709,730 B2 | 5/2010 | Johnson et al. | |
| 7,772,484 B2 | 8/2010 | Li et al. | |
| 7,820,906 B2 | 10/2010 | Johnson et al. | |
| 7,825,327 B2 | 11/2010 | Johnson et al. | |
| 7,926,480 B2 | 4/2011 | LeLievre | |
| 7,932,461 B2 | 4/2011 | Johnson et al. | |
| 7,952,057 B2 | 5/2011 | Finot et al. | |
| 7,968,791 B2 | 6/2011 | Do et al. | |
| 8,039,777 B2 | 10/2011 | Lance et al. | |
| 8,049,150 B2 | 11/2011 | Johnson et al. | |
| 8,071,930 B2 | 12/2011 | Wylie et al. | |
| 8,083,362 B2 | 12/2011 | Finot et al. | |
| 8,134,104 B2 | 3/2012 | Finot et al. | |
| 8,410,351 B1 | 4/2013 | Gu | |
| 2001/0017154 A1 | 8/2001 | Washioi | |
| 2003/0024802 A1 | 2/2003 | Burgos | |
| 2003/0121228 A1 | 7/2003 | Stoehr et al. | |
| 2003/0201008 A1 | 10/2003 | Lawheed | |
| 2004/0055594 A1 | 3/2004 | Hochberg et al. | |
| 2004/0093965 A1 | 5/2004 | Hardcastle, III | |
| 2005/0081910 A1 | 4/2005 | Danielson et al. | |
| 2005/0133082 A1 | 6/2005 | Konold et al. | |
| 2006/0150967 A1 | 7/2006 | Hoelle et al. | |
| 2006/0162772 A1 | 7/2006 | Presher et al. | |
| 2006/0174930 A1 | 8/2006 | Murphy et al. | |
| 2006/0231133 A1 | 10/2006 | Fork et al. | |
| 2006/0249143 A1 | 11/2006 | Straka | |
| 2007/0034207 A1 | 2/2007 | Niedermeyer | |
| 2007/0056579 A1 | 3/2007 | Straka | |
| 2007/0068162 A1 | 3/2007 | Komura et al. | |
| 2007/0089775 A1 | 4/2007 | Lasich | |
| 2007/0175871 A1 | 8/2007 | Brezni et al. | |
| 2007/0251569 A1 | 11/2007 | Shan et al. | |
| 2008/0053701 A1 | 3/2008 | Antaya et al. | |
| 2008/0127967 A1 | 6/2008 | Kimura et al. | |
| 2008/0216887 A1 | 9/2008 | Hacke et al. | |
| 2008/0271776 A1 | 11/2008 | Morgan | |
| 2008/0302357 A1 | 12/2008 | DeNault | |
| 2008/0302418 A1 | 12/2008 | Buller et al. | |
| 2008/0308091 A1 | 12/2008 | Corio | |
| 2008/0308094 A1 | 12/2008 | Johnston | |
| 2009/0000662 A1 | 1/2009 | Harwood et al. | |
| 2009/0014058 A1 | 1/2009 | Croft et al. | |
| 2009/0056698 A1 | 3/2009 | Johnson et al. | |
| 2009/0056785 A1 | 3/2009 | Johnson et al. | |
| 2009/0056786 A1 | 3/2009 | Johnson et al. | |
| 2009/0056787 A1 | 3/2009 | Johnson et al. | |
| 2009/0065045 A1 | 3/2009 | Tsadka et al. | |
| 2009/0114261 A1 | 5/2009 | Stancel et al. | |
| 2009/0114281 A1 | 5/2009 | Gobel | |
| 2009/0126774 A1 | 5/2009 | Taylor, II et al. | |
| 2009/0173375 A1 | 7/2009 | Frazier et al. | |
| 2009/0178704 A1 | 7/2009 | Kalejs et al. | |
| 2009/0183731 A1 | 7/2009 | Capan | |
| 2009/0211644 A1 | 8/2009 | Wylie et al. | |
| 2009/0223550 A1 | 9/2009 | Curtin et al. | |
| 2009/0308379 A1 | 12/2009 | Capan | |
| 2009/0314283 A1 | 12/2009 | Kimura et al. | |
| 2010/0000165 A1 | 1/2010 | Koller | |
| 2010/0031991 A1 | 2/2010 | Mochizuki et al. | |
| 2010/0089435 A1 | 4/2010 | Lockenhoff | |
| 2010/0126554 A1 | 5/2010 | Morgan et al. | |
| 2010/0132776 A1 | 6/2010 | Nakata | |
| 2010/0147347 A1 | 6/2010 | Dyreby et al. | |
| 2010/0163014 A1 | 7/2010 | Johnson et al. | |
| 2010/0170501 A1 | 7/2010 | Albritton | |
| 2010/0193014 A1 | 8/2010 | Johnson et al. | |
| 2010/0207951 A1 | 8/2010 | Plaisted et al. | |
| 2010/0218807 A1 | 9/2010 | Arbore et al. | |
| 2010/0236626 A1 | 9/2010 | Finot et al. | |
| 2010/0288332 A1 | 11/2010 | O'Neill et al. | |
| 2010/0294336 A1 | 11/2010 | Johnson et al. | |
| 2010/0319684 A1 | 12/2010 | Almogy et al. | |
| 2011/0017267 A1 | 1/2011 | Lichy et al. | |
| 2011/0023940 A1 | 2/2011 | Do et al. | |
| 2011/0036345 A1 | 2/2011 | Almogy et al. | |
| 2011/0061719 A1 | 3/2011 | Tsadka et al. | |
| 2011/0108090 A1 | 5/2011 | Lance et al. | |
| 2011/0114154 A1 | 5/2011 | Lichy et al. | |
| 2011/0132457 A1 | 6/2011 | Finot | |
| 2011/0162692 A1 | 7/2011 | Giacalone et al. | |
| 2011/0168161 A1 | 7/2011 | Capan | |
| 2011/0226309 A1 | 9/2011 | Do et al. | |
| 2011/0226310 A1 | 9/2011 | Johnson et al. | |
| 2011/0265869 A1 | 11/2011 | Finot et al. | |
| 2011/0271999 A1 | 11/2011 | Almogy et al. | |
| 2011/0284055 A1 | 11/2011 | Almogy et al. | |
| 2012/0042932 A1 | 2/2012 | Wylie et al. | |
| 2012/0318318 A1 | 12/2012 | Metin et al. | |
| 2012/0318319 A1 | 12/2012 | Pinarbasi et al. | |
| 2012/0325282 A1 | 12/2012 | Snow et al. | |
| 2013/0112237 A1 | 5/2013 | Almogy et al. | |
| 2013/0206221 A1 | 8/2013 | Gannon et al. | |

FOREIGN PATENT DOCUMENTS

| | | | |
|---|---|---|---|
| WO | WO 03022578 A1 | 3/2003 | |
| WO | WO 2005-057092 A1 | 6/2005 | |
| WO | WO 2005-090873 A1 | 9/2005 | |
| WO | WO 2006-000834 A1 | 1/2006 | |
| WO | WO 2006-120475 A1 | 11/2006 | |
| WO | WO 2007-022756 A2 | 3/2007 | |
| WO | WO 2007-087680 A1 | 8/2007 | |
| WO | WO 2007-109900 A1 | 10/2007 | |
| WO | WO 2007-110713 A1 | 10/2007 | |
| WO | WO 2007-129146 A1 | 11/2007 | |
| WO | WO 2008-105913 A2 | 9/2008 | |
| WO | WO 2008-112180 A9 | 9/2008 | |
| WO | WO 2008-143482 A2 | 11/2008 | |
| WO | WO 2009-002350 A1 | 12/2008 | |
| WO | WO 2009-011013 | 1/2009 | |
| WO | WO 2009-029275 A2 | 3/2009 | |
| WO | WO 2009-032917 A2 | 3/2009 | |
| WO | WO 2009-032920 A2 | 3/2009 | |
| WO | WO 2009-034573 A2 | 3/2009 | |
| WO | WO 2009-061495 A1 | 5/2009 | |
| WO | WO 2009-076740 A1 | 6/2009 | |
| WO | WO 2009-090538 A2 | 7/2009 | |
| WO | WO 2009-096754 A2 | 8/2009 | |
| WO | WO 2009-103077 A2 | 8/2009 | |
| WO | WO 2009-137864 A1 | 11/2009 | |
| WO | WO 2009-146215 A2 | 12/2009 | |

(56) References Cited

FOREIGN PATENT DOCUMENTS

| WO | WO 2010-004420 A2 | 1/2010 |
|---|---|---|
| WO | WO 2010-017422 A2 | 2/2010 |
| WO | WO 2010-035064 A1 | 4/2010 |
| WO | WO 2010-047656 A1 | 4/2010 |
| WO | WO 2010-048677 A1 | 5/2010 |
| WO | WO 2010-096001 A1 | 8/2010 |
| WO | WO 2010-099236 A1 | 9/2010 |
| WO | WO 2010-108141 A2 | 9/2010 |
| WO | WO 2010-132312 A1 | 11/2010 |
| WO | WO 2010-138606 A1 | 12/2010 |
| WO | WO 2010-138606 A2 | 12/2010 |
| WO | WO 2010-138606 A3 | 12/2010 |
| WO | WO 2011-014690 A2 | 2/2011 |
| WO | WO 2011-062902 A1 | 5/2011 |
| WO | WO 2011-069079 A2 | 6/2011 |
| WO | WO 2011-134759 A2 | 11/2011 |
| WO | WO 2011-139494 A1 | 11/2011 |
| WO | WO 2011-139852 A2 | 11/2011 |
| WO | WO 2011-141198 A2 | 11/2011 |
| WO | WO 2011-146177 A1 | 11/2011 |
| WO | WO 2011-149589 A1 | 12/2011 |
| WO | WO 2012-003235 A1 | 1/2012 |
| WO | WO 2012-005747 A1 | 1/2012 |
| WO | WO 2012-113478 A1 | 8/2012 |
| WO | WO 2013-122639 | 8/2013 |

OTHER PUBLICATIONS

PCT/US2011/032163 International Search Report and Written Opinion mailing date Jun. 27, 2011; 21 pp.
PCT/US2011/032169 International Search Report and Written Opinion mailing date Jul. 5, 2011; 24 pp.
PCT/US/2010/025280 International Preliminary Report and Written Opinion, mailing date May 3, 2010; 5 pp.
PCT/US2010/025280 International Search Report and Written Opinion, mailing date May 3, 2010; 6 pp.
PCT/US2011/031117 International Search Report 4 pp. and Written Opinion 16 pg; mailing date Jun. 20, 2011; 20 pp.
Bunea, Marius M., et al., Simulation and Characterization of High Efficiency Back Contact Cells for Low-Concentration Photovoltaics; Photovoltaic Specialists Conference (PVSC), 2010 35th IEEE; Jun. 20-25, 2010; pp. 000873-000876, ISSN: 0160-8371; Print ISBN: 978-1-4244-5890-S; Honolulu, HI.
Judkins, Zachary S., et al.; Performance Results of a Low-Concentration Photovoltaic System Based on High Efficiency Back Contact Cells; 25th European Photovoltaic Solar Energy Conference and Exhibition / 5th World Conference on Photovoltaic Energy Conversion; Sep. 6-10, 2010; pp. 123-127; Valencia, Spain.
U.S. Appl. No. 12/622,416 Final Office Action mailing date Jun. 21, 2011, 15 pp.
U.S. Appl. No. 12/622,416 Office Action mailed Nov. 23, 2010.
U.S. Appl. No. 12/622,416 Amendment filed Apr. 18, 2011.
U.S. Appl. No. 12/622,416 RCE and Amendment filed Dec. 21, 2011.
U.S. Appl. No. 12/712,122 Office Action mailed Nov. 30, 2012.
U.S. Appl. No. 12/774,436 Office Action dated Dec. 7, 2012.
U.S. Appl. No. 12/788,048 Amendment filed Jun. 18, 2012.
U.S. Appl. No. 12/788,048 Office Action mailed Jan. 18, 2012.
U.S. Appl. No. 12/788,048 Office Action mailed Nov. 8, 2012.
U.S. Appl. No. 12/887,958 Office Action mailed Mar. 14, 2012.
U.S. Appl. No. 12/912,177 Amendment filed Jul. 13, 2012.
U.S. Appl. No. 12/912,177 Amendment filed Jun. 18, 2012.
U.S. Appl. No. 12/912,177 Office Action mailed Jan. 17, 2012.
U.S. Appl. No. 12/912,177 Office Action mailed Jun. 25, 2012.
Laila S. Mattos, et al.; New Module Efficiency Record: 23.5% under 1-Sun Illumination Using Thin-film Single-junction GaAs Solar Cells; 38th IEEE PVSC Jun. 3-8 2012; Alta Devices, Inc., Santa Clara, CA USA; pp. 003187-003190.
Mathur, S. S., et al.; Geometrical Designs and Performance Analysis of a Linear Fresnel Reflector Solar Concentrator With a Flat Horizontal Absorber; International Journal of Energy Research, vol. 14, pp. 107-124; 1990; Jan. 18, 1989, John Wiley & Sons, Ltd.
EP107249385 Response to Written Opinion 161/162 filed Jul. 23, 2012.
PCT/US/2010/56847 International Preliminary Report and Written Opinion mailing date May 31, 2012.
PCT/US2010/036220 International Preliminary Report on Patentability and Written Opinion mailing Nov. 29, 2011; 8 pp.
PCT/US2011/031117 International Preliminary Report on Patentability and Written Opinion mailing date Nov. 27, 2012; 17 pp.
PCT/US2011/032163 International Preliminary Report on Patentability and Written Opinion mailing date Nov. 6, 2012; 13 pp.
PCT/US2011/032169 International Preliminary Report on Patentability and Written Opinion mailing date Nov. 20, 2012; 17 pp.
Hittite Solar Energy; Pages from http://www.hittitesolarenergy.com; Accessed on Feb. 7, 2013; 6 pp.
Smeltink, J.F.H., et al., 40kW PV Thermal Roof Mounted Concentrator System, Conference Record of the 2006 IEEE $4^{th}$ World Conference on Photovoltaic Energy Conversion, May 2006, pp. 636-639.
Sala, G., et al., 480 kW peak Euclides Concentrator Power Plant Using Parabolic Troughs, $2^{ND}$ World Conference and Exhibition PVSEC, 1998, pp. 1963-1968.
Smeltink, J.F.H, et al., A 40Kw Roof Mounted PV Thermal Concentrator System, $20^{th}$ EC PV Solar Energy Conference, Mar. 27, 2006, 4 pgs.
Smeltink, J., et al., A hybrid pv-thermal linear microconcentrator for domestic application, $22^{nd}$ EU PVSEC, 2007, 4 pgs.
Chow, T.T., A review on photovoltaic/thermal hybrid solar technology, Applied Energy, Feb. 2010, pp. 365-379, available online Jul. 25, 2009.
Kempe, M.D., et al., Accelerated Stress Testing of Hydrocarbon-Based Encapsulants for Medium-Concentration CPV Applications, $34^{th}$ IEEE Photovoltaic Specialists Conference (PVSC), Jun. 7-12, 2009, pp. 1826-1831.
Mason, N.B. et al., Advanced Laser Processing for Industrial Solar Cell Manufacturing, 2006, 62 pgs, Department of Trade and Industry (United Kingdom).
Price, Hank, et al., Advances in Parabolic Trough Solar Power Technology, Journal of Solar Energy Engineering, May 2002, pp. 109-125, vol. 124.
Miller, D.C., et al., Analysis of Transmitted Optical Spectrum Enabling Accelerated Testing of CPV Designs, SPIE 2009 Solar Energy + Technology Conference, Aug. 2-6, 2009, Jul. 2009 preprint, 15 pgs.
Le Lievre, Peter, Chromasun Photovoltaic; Heating-Cooling; Daylighting—all in a single panel, Cleantech Showcase—Abu Dhabi, Jan. 21, 2009, 21 pgs.
Combined Heat and Power Solar (CHAPS), brochure, Nov. 2004, 2 pgs., Australian National University Centre for Sustainable Energy Systems.
Crowley, Mark, Commercialization of CPV in 2010—Toward the First 100 MW, CPV Today $2^{nd}$ Concentrated Photovoltaic Summit US, Feb. 2-3, 2010, 17 pgs.
Fraas, Lewis, Concentrated Photovoltaics (CPV): Path to Affordable Solar Electric Power, Southeast Solar Summit, Nov. 2007, 22 pgs.
Grama, Sorin, et al., Concentrating Solar Power—Technology, Cost, and Markets, 2008 Industry Report, 2008, 149 pgs, Prometheus Institute for Sustainable Development and Greentech Media.
Royne, Anja, et al., Cooling of Photovoltaic cells under concentrated illumination: a critical review, Solar Energy Materials & Solar Cells, 2005, pp. 451-483, vol. 86, Elsevier.
Boehm, Robert, CPV—Competing and Beating Other Solar Technologies, CPV Today $2^{nd}$ Concentrated Photovoltaic Summit USA, Feb. 2-3, 2010, 62 pgs.
Skumanich, Andy, CPV: Market Considerations for 2010 and Beyond, CPV Conference Feb. $3^{rd}$ 2010, 31 pgs.
Shisler, Bill, CPV Qualification and Safety Testing, CPV Today $2^{nd}$ Concentrated Photovoltaic Summit—US, Feb. $3^{rd}$ 2010, 19 pgs.
Lerchenmuller, Hansjorg, CPV Super Panel—The CPV Landscape, CPV Today $2^{nd}$ Concentrated Photovoltaic Summit—US, Feb. 2, 2010, 21 pgs.

(56) References Cited

OTHER PUBLICATIONS

CPV Systems: The Road to Successful Deployments, CPV Today $2^{nd}$ Concentrated Photovoltaic Summit—US, Feb. 2-3, 2010, 11 pgs.
Plesniak, Adam, Deployment and Performance of Boeing HCPV Modules and Arrays, CPV Today $2^{nd}$ Concentrated Photovoltaic Summit—US, Feb. 3, 2010, 18 pgs.
Etzkorn, Edward V., DOE Outlook and Opportunities for CPV, CPV Today $2^{nd}$ Concentrated Photovoltaic Summit—US, Feb. 2, 2010, 33 pgs.
Fraas, Dr. Lewis, Economic Comparisons of the Various PV Options, CPV Today Concentrated Photovoltaics Summit USA, Feb. 4, 2009, 21 pgs.
Kempe, M.D., et al., Ethylene-Vinyl Acetate Potential Problems for Photovoltaic Packaging, 2006 IEEE $4^{th}$ World Conference on Photovoltaic Energy Conversion (WCPEC-4), May 7-12, 2006, 6 pgs.
Lupfert, Eckhard, Eurotrough Design Issues and Prototype Testing at PSA, Proceedings of the Solar Forum 2001, Solar Energy: The Power to Choose, Apr. 21-25, 2001, 5 pgs.
O'Neill, Mark, Fifth-Generation 20X Linear Fresnel Lens Silicon Cell Concentrator Technology, Fifth International Conference on Solar Concentrators (ICSC-5), Nov. 19, 2008, pp. 1-23.
Cohen, Gilbert E., et al., Final Report on the Operation and Maintenance Improvement Program for Concentrating Solar Power Plants, Jun. 1999, pp. 1-186, issued by Sandia National Laboratories.
Zondag, Herbert, et al., Guidelines for performance measurements of liquid-cooled non-concentrating PVT collectors using c-Si cells, 2006, pp. 1-41, issued by PV Catapult.
Tobias, Ignacio, et al., Handbook of Photovoltaic Science and Engineering, Chapter 7—Crystalline Silicon Solar Cells and Modules, 2003, pp. 255-306, 2003 John Wiley & Sons, Ltd.
Anderson, William G., et al., Heat Pipe Cooling of Concentrating Photovoltaic (CPV) Systems, 6th International Energy Conversion Engineering Conference (IECEC), Jul. 28-30, 2008, pp. 1-9.
Neuhaus, Dirk-Holger, et al., Industrial Silicon Wafer Solar Cells, Advances in OptoElectronics, 2007, pp. 1-15, Hindawi Publishing Corporation.
Mirroxx Linear Fresnel Collector Technology, (brochure), 2009, 8 pgs.
Cohen, Gilbert, et al., Parabolic Trough Concentrator Development, USA Trough Third Annual Parabolic Trough Workshop, Jun. 18, 2000, pp. 1-13.
Smeltink, J. et al., Performance monitoring of a pv thermal concentrator system, 22nd EU PVSEC, 2007, 4 pgs.
Birkmire, R. W., et al., Processing Materials, Devices and Diagnostics for Thin Film Photovoltaics: Fundamental and Manufacturability Issues, Annual Report to National Renewable Energy Laboratory by Institute of Energy Conversion University of Delaware, Apr. 1, 2007-Dec. 31, 2007, pp. 1-77.
Kaminar, N.R., et al., PVMaT Improvements in the Manufacturing of the PVI Powergrid, Final Technical Report, Oct. 1999, 77 pgs.
Affolter, Pascal, et al., PVT Roadmap, Accessed from the world wide web Jan. 3, 2010, 91 pgs.
Harwood, D., et al., Receiver Development for Rooftop Concentrator Applications, International Conference on Solar Concentrators (ICSC-4), 2007, 4 pgs.
Renewable Energy Technology Characterizations, Topical Report TR-109496 , Dec. 1997, 283 pgs, Office of Utility Technologies, Energy Efficiency and Renewable Energy, U.S. Department of Energy and Electric Power Research Institute.
Kennedy, Cheryl, Session CSP Advanced Systems: Optical Materials, 2008 Solar Annual Review Meeting, 27 pgs.
SkyFuel & SkyTrough Questions and Answers, (brochure), 2009, 6 pgs, www.SkyFuel.com.
SkyTrough Parabolic Trough Concentrator, (brochure), 2009, 2 pgs., www.SkyFuel.com.
SkyTrough Parabolic Trough Collector Assembly, (brochure), 2 pgs., www.Skyfuel.com.
Weatherby, Clive, Solar CPV—a great opportunity for traditional manufacturing industry, CPV Today Concentrated Photovoltaic Summit USA, Feb. 3-4, 2009, pp. 1-33.
Meydbray, Y., et al., Solder Joint Degradation in High Efficiency All Back Contact Solar Cells, Proceedings of the 22nd European Photovoltaic Solar Energy Conference, 2007, 5 pgs.
Sala, G., et al., Test, Rating and Specification of PV Concentrator Components and Systems, Book 1, Classification of PV Concentrators, Chapter 3—History of Concentrators, Jan. 31, 2002, pp. 1, 13-57.
Morvillo, Pasquale, The ENEA c-Si high efficiency solar cell, Tutorial on PV-Concentrators Technology, 2007, 32 pgs.
Swanson, Richard M., The Promise of Concentrators, Progress in Photovoltaics: Research and Applications, 2000, pp. 93-111, John Wiley & Sons, Ltd.
Coventry, Franklin J., et al., Thermal and electrical performance of a concentrating PV/Thermal collector: results from the ANU CHAPS collector, 2002, 6 pgs., ANZSES Solar Energy Conference, Newcastle, Australia.
Van Kessel, Theodore, Thermal Management for CPV at 2000 Suns, CPV Today 2nd Concentrated Photovoltaic Summit—US, Feb. 2-3, 2010, 36 pgs.
Lee, B., et al., Thermally conductive and electrically insulating EVA composite encapsulants for solar photovoltaic (PV) cell, Express Polymer Letters, 2008, pp. 357-363, vol. 2, No. 5.
Youssef, Cherif, Utility's Perspective to Concentrated Solar . . . , CPV Today 2nd Annual Concentrated Photovoltaic Summit USA, Feb. 2, 2010, 28 pgs.
Non-Final Office Action dated Nov. 23, 2010 (U.S. Appl. No. 12/622,416) 14 pages.
International Search Report and Written Opinion for PCT/US/10/56847, Mar. 3, 2011; 11 pages.
International Search Report PCT/US/10/25280, May 2, 2010; 2 pages.
U.S. Appl. No. 12/622,416 Office Action mailed Aug. 15, 2013.
U.S. Appl. No. 12/774,436 Amendment dated Dec. 7, 2012.
U.S. Appl. No. 12/774,436 Office Action dated Aug. 29, 2013.
U.S. Appl. No. 12/788,048 RCE and Amendment filed May 8, 2013.
U.S. Appl. No. 12/912,177 Office Action mailed Oct. 7, 2013.
U.S. Appl. No. 13/607,570 Amendment dated Oct. 9, 2013.
U.S. Appl. No. 13/607,570 Office Action dated Apr. 11, 2013.
U.S. Appl. No. 13/619,952 Office Action dated May 16, 2013.
U.S. Appl. No. 13/763,412 Office Action dated May 21, 2013.
U.S. Appl. No. 13/763,429 Office Action dated May 23, 2013.
U.S. Appl. No. 13/079,193 Office Action dated May 1, 2013.
AU2010322164 Examination Report dated Sep. 9, 2013.
PCT/US2013/034383 International Search Report and Written Opinion mailing date Jun. 28, 2013.

* cited by examiner

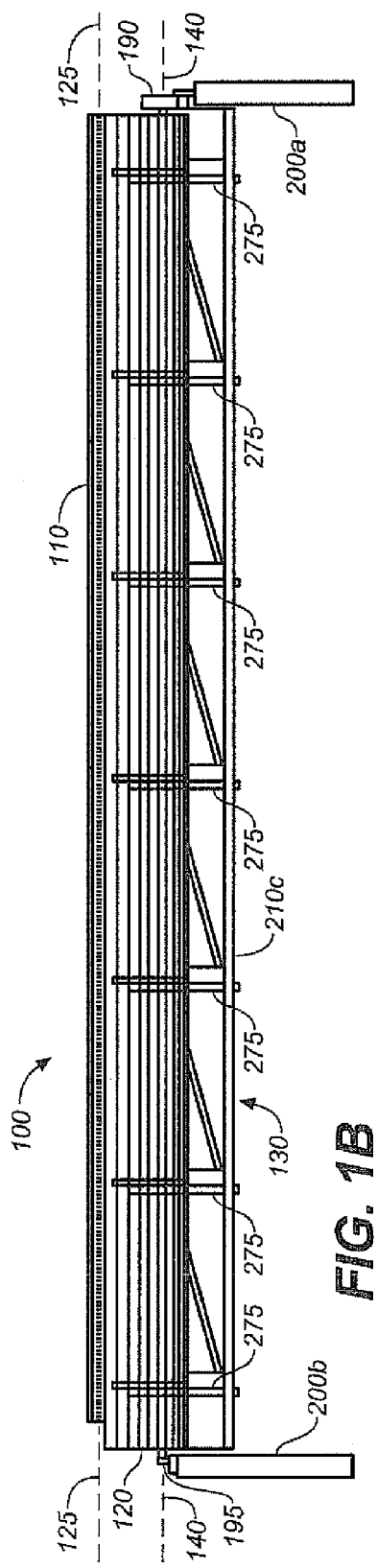
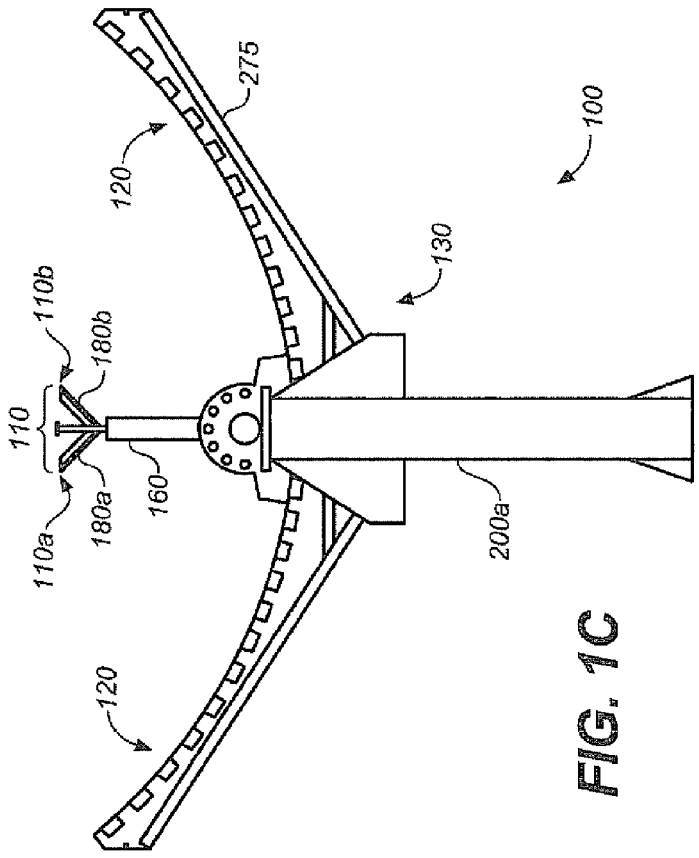

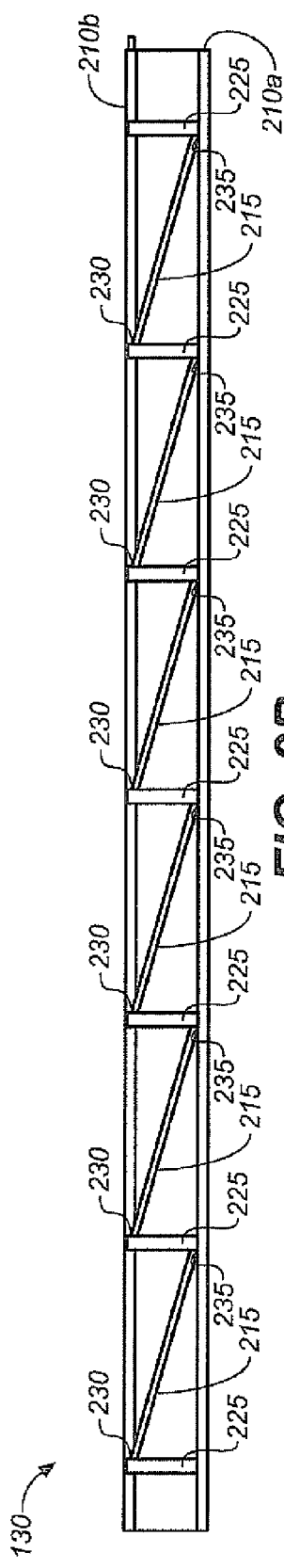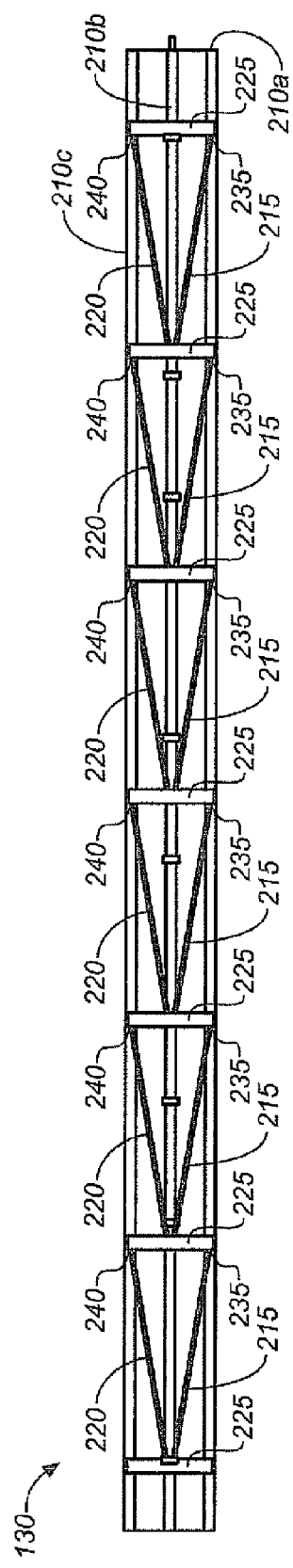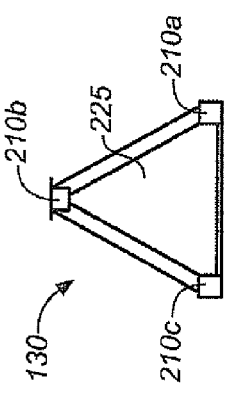

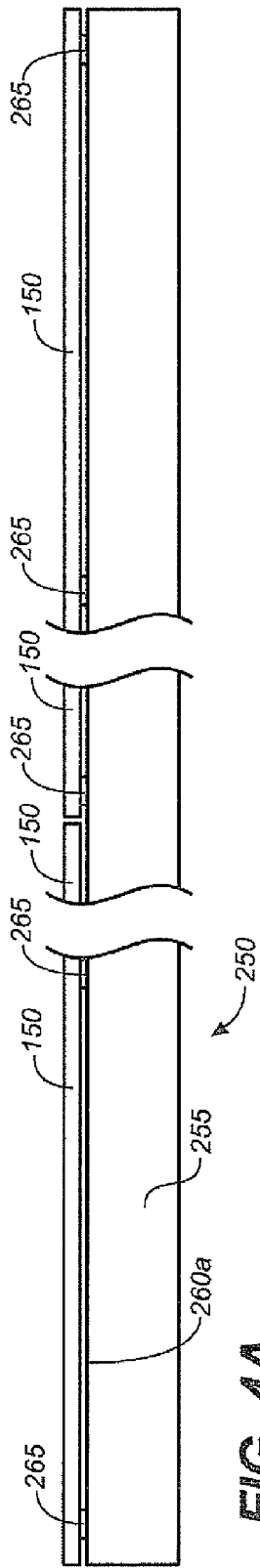
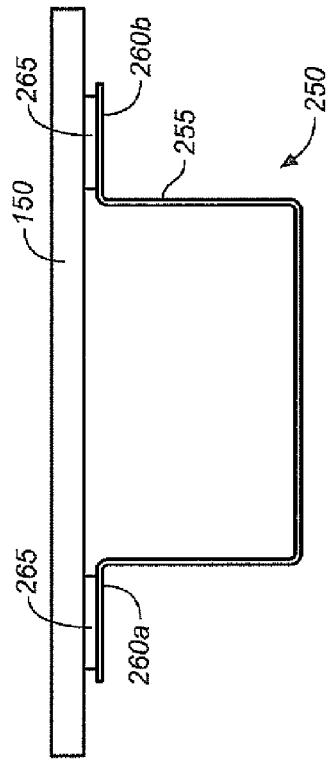
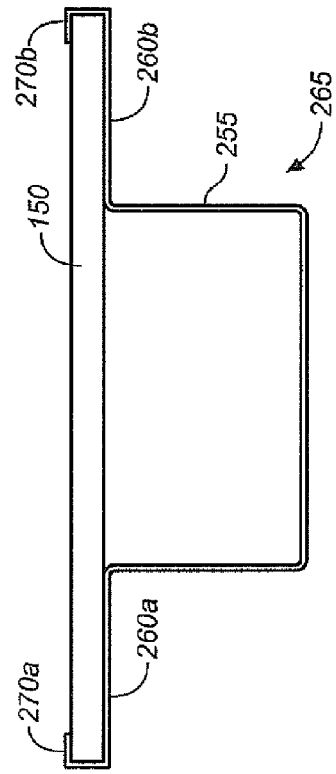

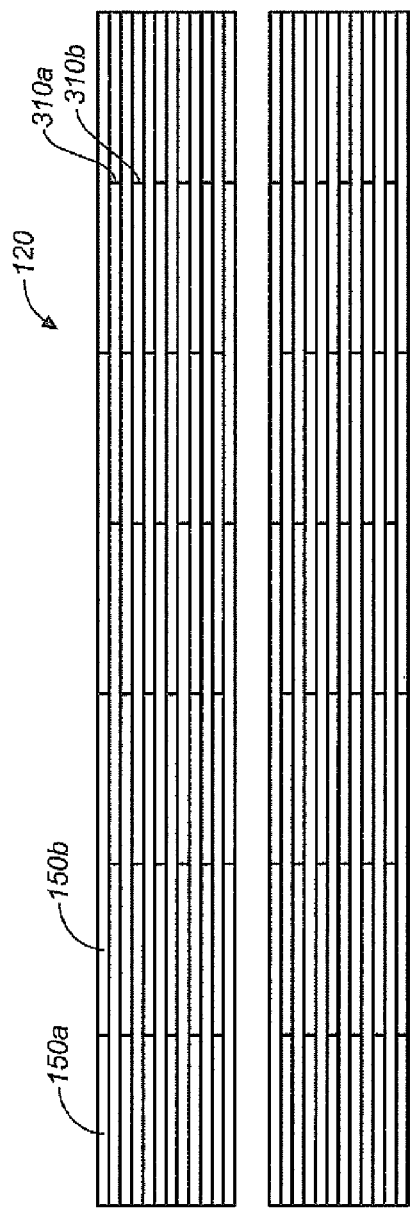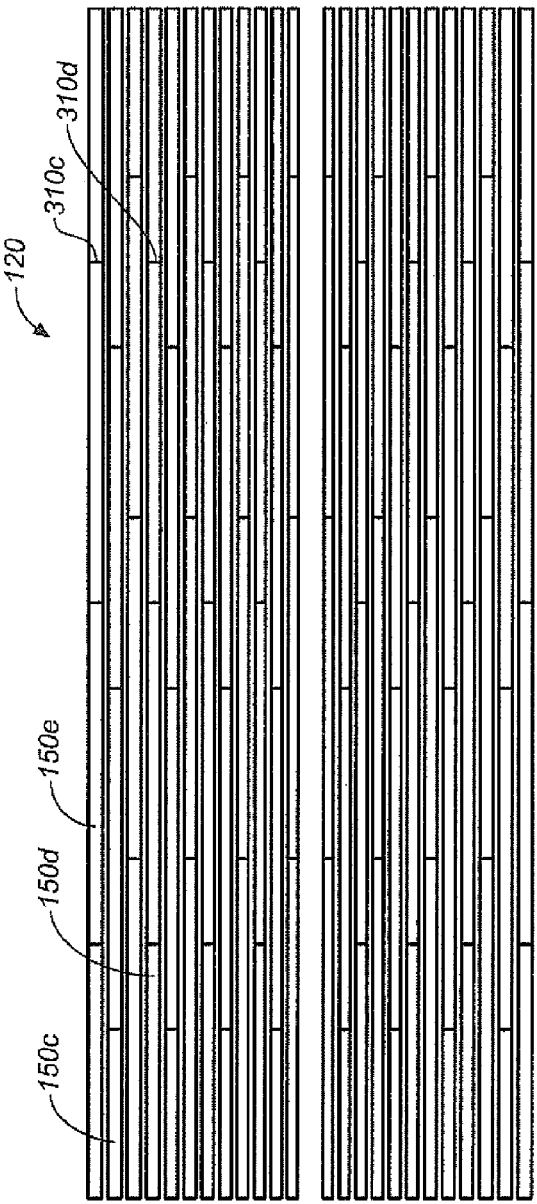

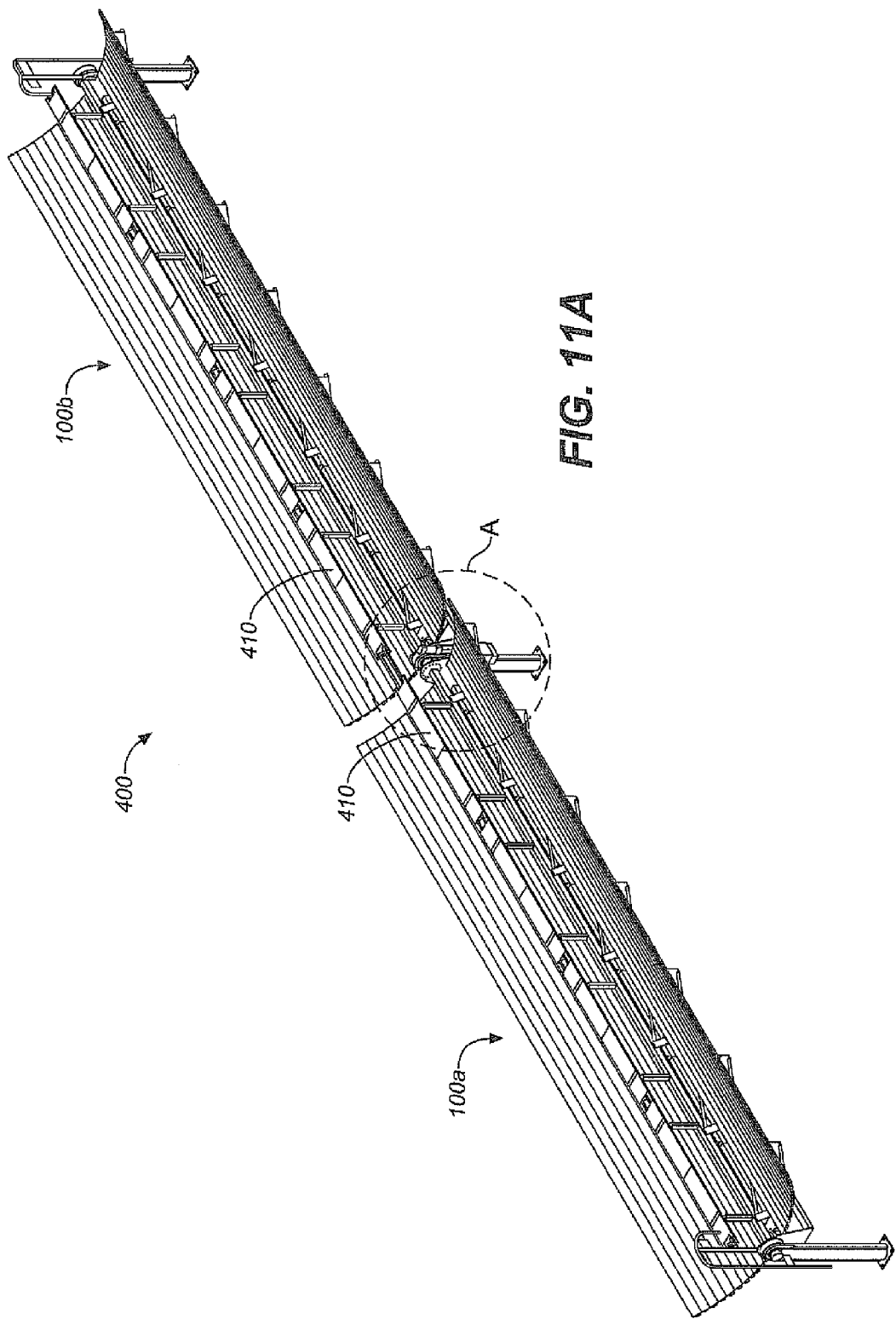

CONCENTRATING SOLAR ENERGY COLLECTOR

FIELD OF THE INVENTION

The invention relates generally to the collection of solar energy to provide electric power, heat, or electric power and heat.

BACKGROUND

Alternate sources of energy are needed to satisfy ever increasing world-wide energy demands. Solar energy resources are sufficient in many geographical regions to satisfy such demands, in part, by provision of electric power and useful heat.

SUMMARY

Systems, methods, and apparatus by which solar energy may be collected to provide electricity, heat, or a combination of electricity and heat are disclosed herein.

In one aspect, a concentrating solar energy collector comprises a linearly extending receiver, a linearly extending reflector oriented parallel to a long axis of the receiver and fixed in position with respect to the receiver, and a linearly extending support structure supporting the receiver and the reflector and pivotally mounted to accommodate rotation of the support structure, the reflector, and the receiver about a rotation axis parallel to the long axis of the receiver. The linearly extending support structure comprises three longitudinal members oriented parallel to the rotation axis, extending at least substantially the length of the reflector, and arranged to form a framework having a triangular cross-section perpendicular to the rotation axis.

In some variations of this aspect, the rotational axis is coincident or substantially coincident with one of the three longitudinal members. In addition, or alternatively, a first one of the longitudinal members may be located on a reflective side of the reflector and the other two longitudinal members located on an opposite side of the reflector from the first longitudinal member.

In further variations comprising the features of any of the above variations of this aspect, the support structure may comprises a first plurality of diagonal members connecting a first one of the longitudinal members to a second one of the longitudinal members, and a second plurality of diagonal members connecting the first longitudinal member to the third one of the longitudinal members. The support structure may also, or alternatively, comprise a plurality of transverse plates, each transverse plate oriented perpendicular to and connecting the three longitudinal members. In variations comprising the diagonals and the transverse plates, the first plurality of diagonal members may each connect a joint between a corresponding one of the transverse plates and a first one of the longitudinal members to a joint between an adjacent transverse plate and a second one of the longitudinal members. Similarly, the second plurality of diagonal members may each connect a joint between a corresponding one of the transverse plates and a first one of the longitudinal members to a joint between an adjacent transverse plate and the third one of the longitudinal members. In such variations, the plurality of transverse plates, the first plurality of diagonals, and the second plurality of diagonals may together form a repeating pattern along the longitudinal members.

In further variations comprising the features of any of the above variations of this aspect, the reflector may comprise a plurality of linearly extending reflective elements oriented parallel to the long axis of the receiver and fixed in position with respect to each other and with respect to the receiver. The support structure may comprise a plurality of separate longitudinal reflector supports each of which has a long axis oriented parallel to the rotation axis and each of which comprises a channel portion parallel to its long axis, a first (optionally, planar) lip portion on one side of and parallel to the channel portion, and a second (optionally, planar) lip portion parallel to and on an opposite side of the channel portion from the first lip portion. Each reflective element may be attached to and supported by the lip portions, and bridge the channel portion, of a corresponding one of the longitudinal reflector supports. The support structure may also comprise a plurality of transverse reflector supports extending away from the rotation axis. Each transverse reflector support may comprise a plurality of notches, with each notch in a transverse reflector support corresponding to a separate longitudinal reflector support. In such variations, the channel portion of each longitudinal reflector support may be positioned in corresponding notches of the transverse reflector supports with the lip portions of each longitudinal reflector support in contact with and supported by surfaces of the transverse reflector supports adjacent to the corresponding notches.

In further variations comprising the features of any of the above variations of this aspect, the reflector may comprise a plurality of linearly extending reflective elements oriented parallel to the long axis of the receiver and fixed in position with respect to each other and with respect to the receiver. Each linearly extending reflective element may comprise a low-iron glass layer having a first surface and a second surface, with the first surface oriented facing the receiver, a reflective layer disposed on the second surface of the low-iron glass layer, an adhesive disposed on the reflective layer, and a second glass layer attached by the adhesive to the reflective layer, to the low-iron glass layer, or to both the reflective layer and the low-iron glass layer.

In further variations comprising the features of any of the above variations of this aspect, the reflector may comprise a plurality of linearly extending reflective elements oriented parallel to the long axis of the receiver and fixed in position with respect to each other and with respect to the receiver. The linearly extending reflective elements may be of at least two different lengths and arranged in parallel side-by side rows, with each row including two or more of the linearly extending reflective elements arranged end-to-end, such that gaps or joints between the reflective elements in one row are not next to gaps or joints between reflective elements in an adjacent row. In some of these variations, no gaps or joints between reflective elements in any row are next to gaps or joints between reflective elements in any adjacent row. In some variations, the majority of gaps or joints between reflective elements in any row are not adjacent to gaps or joints between reflective elements in any adjacent row.

In further variations comprising the features of any of the above variations of this aspect, the receiver may comprise solar cells. In such variations, the receiver may also comprise coolant channels accommodating flow of liquid coolant in thermal contact with the solar cells. In alternative further variations based on any of the above variations, except for that just preceding this variation, the receiver may accommodate flow of a liquid to be heated by solar energy concentrated on the receiver, but lack solar cells.

In further variations comprising the features of any of the above variations of this aspect that comprise transverse reflector supports and transverse plates, the transverse reflector supports may be attached to corresponding ones of the transverse plates.

In further variations comprising the features of any of the above variations of this aspect, the reflector may be a parabolic reflector. In further variations based on any of the above variations of this aspect in which the reflector comprises a plurality of linear reflective elements, the linear reflective elements may together form a parabolic reflector.

In further variations comprising the features of any of the above variations of this aspect in which the reflector comprises a plurality of linear reflective elements, the linearly extending reflective elements may be flat or substantially flat.

In another aspect, a concentrating solar energy collector comprises a linearly extending receiver, a plurality of linearly extending reflective elements oriented parallel to a long axis of the receiver and fixed in position with respect to each other and with respect to the receiver, and a linearly extending support structure supporting the receiver and the reflective elements and pivotally mounted to accommodate rotation of the support structure, the reflective elements, and the receiver about a rotation axis parallel to the long axis of the receiver. The support structure comprises a plurality of separate longitudinal reflector supports each of which has a long axis oriented parallel to the rotation axis and each of which comprises a channel portion parallel to its long axis, a first (optionally, planar) lip portion on one side of and parallel to the channel portion, and a second (optionally, planar) lip portion parallel to and on an opposite side of the channel portion from the first lip portion. Each reflective element is attached to and supported by the lip portions, and bridges the channel portion, of a corresponding one of the longitudinal reflector supports.

In some variations of this aspect, the longitudinal reflector supports are trough shaped. Such a trough shape may have, for example, a V or U shaped cross-section. In some variations, the longitudinal reflector support comprises multiple channel portions (e.g., 2, 3, or more than 3) side-by-side in parallel, between the lip portions. In such variations, the longitudinal reflector support may have, for example, a W shaped cross section or a cross-section that may be viewed as composed of multiple V or U shapes side-by-side.

In further variations comprising the features of any of the above variations of this aspect, the lips and channel portion of each longitudinal reflector support may be formed from a continuous piece of sheet metal.

In further variations comprising the features of any of the above variations of this aspect, the linearly extending reflective elements may be of at least two different lengths and be arranged in parallel side-by side rows, with each row including two or more of the linearly extending reflective elements arranged end-to-end, such that gaps or joints between the reflective elements in one row are not next to gaps or joints between reflective elements in an adjacent row. In some of these variations, no gaps or joints between reflective elements in any row are next to gaps or joints between reflective elements in any adjacent row. In some variations, the majority of gaps or joints between reflective elements in any row are not adjacent to gaps or joints between reflective elements in any adjacent row.

In further variations comprising the features of any of the above variations of this aspect, each linearly extending reflective element may comprise a low-iron glass layer having a first surface and a second surface, with the first surface oriented facing the receiver, a reflective layer disposed on the second surface of the low-iron glass layer, an adhesive disposed on the reflective layer, and a second glass layer attached by the adhesive to the reflective layer, to the low-iron glass layer, or to both the reflective layer and the low-iron glass layer.

In further variations comprising the features of any of the above variations of this aspect, the support structure may comprise a plurality of transverse reflector supports extending away from the rotation axis. Each transverse reflector support may comprise a plurality of notches, with each notch in a transverse reflector support corresponding to a separate longitudinal reflector support. In such variations, the channel portion of each longitudinal reflector support may be positioned in corresponding notches of the transverse reflector supports with the lip portions of each longitudinal reflector support in contact with and supported by surfaces of the transverse reflector supports adjacent to the corresponding notches. The surfaces of the transverse reflector supports adjacent to the corresponding notches may orient the reflective elements with respect to the receiver with a precision of about 0.5 degrees, for example, or better (i.e., tolerance less than about 0.5 degrees).

In further variations comprising the features of any of the above variations of this aspect that comprise transverse reflector supports, the transverse reflector supports may be formed from continuous metal sheets or plates into which the notches are cut, with the plane of the sheets or plates oriented perpendicular to the rotation axis of the support structure.

In further variations comprising the features of any of the above variations of this aspect, the receiver may comprise solar cells. In such variations, the receiver may also comprise coolant channels accommodating flow of liquid coolant in thermal contact with the solar cells. In alternative further variations based on any of the above variations, except for that just preceding this variation, the receiver may accommodate flow of a liquid to be heated by solar energy concentrated on the receiver, but lack solar cells.

In further variations comprising the features of any of the above variations of this aspect, the linear reflective elements may together form a parabolic reflector.

In further variations comprising the features of any of the above variations of this aspect, the linearly extending reflective elements may be flat or substantially flat.

In another aspect, a concentrating solar energy collector comprises a linearly extending receiver, a plurality of linearly extending reflective elements oriented parallel to a long axis of the receiver and fixed in position with respect to each other and with respect to the receiver, and a linearly extending support structure supporting the receiver and the reflective elements and pivotally mounted to accommodate rotation of the support structure, the reflective elements, and the receiver about a rotation axis parallel to the long axis of the receiver. Each linearly extending reflective element comprises a low-iron glass layer having a first surface and a second surface, with the first surface oriented facing the receiver, a reflective layer disposed on the second surface of the low-iron glass layer, an adhesive disposed on the reflective layer, and a second glass layer attached by the adhesive to the reflective layer, to the low-iron glass layer, or to both the reflective layer and the low-iron glass layer.

In some variations of this aspect, the reflective layer is absent from edge portions of the second surface of the low-iron glass layer, the second glass layer is attached directly to the edge portions by the adhesive, and the adhesive on the edge portions seals the reflective layer from an external environment.

In further variations comprising the features of any of the above variations of this aspect, the second glass layer may comprise, for example, soda-lime glass.

In further variations comprising the features of any of the above variations of this aspect, the low-iron glass layer may be about 1 millimeter to about 2 millimeters thick, and the second glass layer may be about 3 to about 4 millimeters thick.

In further variations comprising the features of any of the above variations of this aspect, the linearly extending reflective elements may be flat or substantially flat.

In further variations comprising the features of any of the above variations of this aspect, the linearly extending reflective elements may be of at least two different lengths and be arranged in parallel side-by side rows, with each row including two or more of the linearly extending reflective elements arranged end-to-end, such that gaps or joints between the reflective elements in one row are not next to gaps or joints between reflective elements in an adjacent row. In some of these variations, no gaps or joints between reflective elements in any row are next to gaps or joints between reflective elements in any adjacent row. In some variations, the majority of gaps or joints between reflective elements in any row are not adjacent to gaps or joints between reflective elements in any adjacent row.

In further variations comprising the features of any of the above variations of this aspect, the receiver may comprise solar cells. In such variations, the receiver may also comprise coolant channels accommodating flow of liquid coolant in thermal contact with the solar cells. In alternative further variations based on any of the above variations, except for that just preceding this variation, the receiver may accommodate flow of a liquid to be heated by solar energy concentrated on the receiver, but lack solar cells.

In further variations comprising the features of any of the above variations of this aspect, the linear reflective elements may together form a parabolic reflector.

In further variations comprising the features of any of the above variations of this aspect, the linearly extending reflective elements may be flat or substantially flat.

In another aspect, a concentrating solar energy collector comprises a linearly extending receiver, a plurality of linearly extending reflective elements oriented parallel to a long axis of the receiver and fixed in position with respect to each other and with respect to the receiver, and a linearly extending support structure supporting the receiver and the reflective elements and pivotally mounted to accommodate rotation of the support structure, the reflective elements, and the receiver about a rotation axis parallel to the long axis of the receiver. The linearly extending reflective elements are of at least two different lengths and are arranged in parallel side-by side rows, with each row including two or more of the linearly extending reflective elements arranged end-to-end, such that gaps or joints between the reflective elements in one row are not next to gaps or joints between reflective elements in an adjacent row.

In some of these variations of this aspect, no gaps or joints between reflective elements in any row are next to gaps or joints between reflective elements in any adjacent row. In some variations, the majority of gaps or joints between reflective elements in any row are not adjacent to gaps or joints between reflective elements in any adjacent row.

In further variations comprising the features of any of the above variations of this aspect, the receiver may comprise solar cells. In such variations, the receiver may also comprise coolant channels accommodating flow of liquid coolant in thermal contact with the solar cells. In alternative further variations based on any of the above variations, except for that just preceding this variation, the receiver may accommodate flow of a liquid to be heated by solar energy concentrated on the receiver, but lack solar cells.

In further variations comprising the features of any of the above variations of this aspect, the linear reflective elements may together form a parabolic reflector.

In further variations comprising the features of any of the above variations of this aspect, the linearly extending reflective elements may be flat or substantially flat.

These and other embodiments, features and advantages of the present invention will become more apparent to those skilled in the art when taken with reference to the following more detailed description of the invention in conjunction with the accompanying drawings that are first briefly described.

BRIEF DESCRIPTION OF THE DRAWINGS

FIGS. 1A-1C show perspective (1A), side (1B), and end (1C) views of an example solar energy collector.

FIGS. 3A-3D show perspective (3A), side (3B), top (3C), and cross-sectional (3D) views of a portion of an example support structure for the reflector and receiver of a solar energy collector.

FIGS. 4A-4C show side (4A) and end (4B, 4C) views of examples of a linearly extending reflective element attached to and supported by a longitudinal reflector support.

FIGS. 6A and 6B show top views of example reflectors comprising linearly extending reflective elements of two or more lengths.

FIG. 11A shows an example of two solar energy collectors sharing a drive and having fluidly coupled receivers.

DETAILED DESCRIPTION

The following detailed description should be read with reference to the drawings, in which identical reference numbers refer to like elements throughout the different figures. The drawings, which are not necessarily to scale, depict selective embodiments and are not intended to limit the scope of the invention. The detailed description illustrates by way of example, not by way of limitation, the principles of the invention. This description will clearly enable one skilled in the art to make and use the invention, and describes several embodiments, adaptations, variations, alternatives and uses of the invention, including what is presently believed to be the best mode of carrying out the invention.

As used in this specification and the appended claims, the singular forms "a," "an," and "the" include plural referents unless the context clearly indicates otherwise. Also, the term "parallel" is intended to mean "substantially parallel" and to encompass minor deviations from parallel geometries rather than to require that parallel rows of reflectors, for example, or any other parallel arrangements described herein be exactly parallel.

This specification discloses apparatus, systems, and methods by which solar energy may be collected to provide electricity, heat, or a combination of electricity and heat. Solar energy collectors as disclosed herein may be used, for example, in some variations of the methods, apparatus, and systems disclosed in U.S. Provisional Patent Application Ser. No. 61/249,151, filed Oct. 6, 2009, titled "Concentrating Solar Photovoltaic-Thermal System," incorporated herein by reference in its entirety.

Figure 1A:
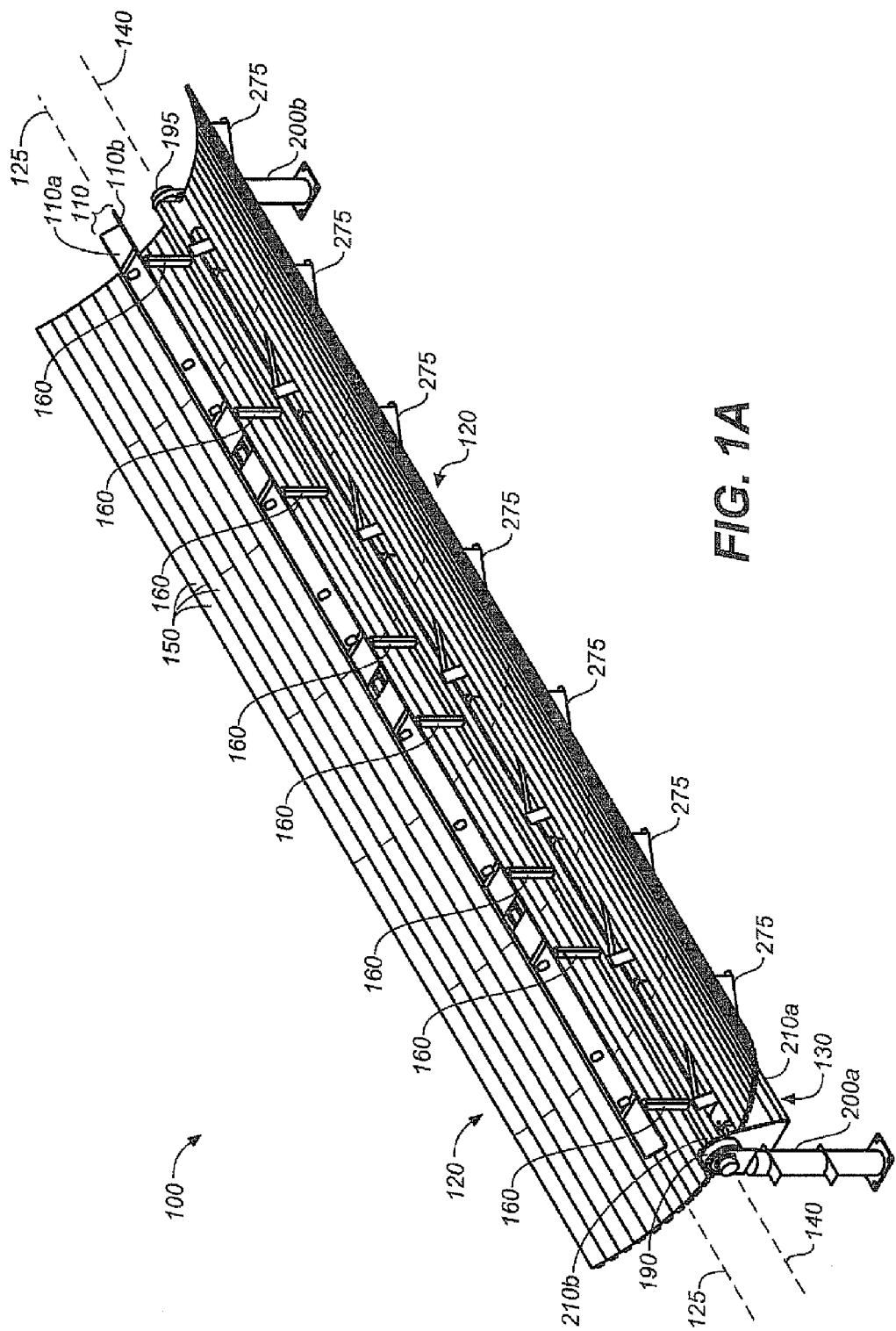

Referring now to FIGS. 1A-1C, an example solar energy collector 100 comprises a linearly extending receiver 110, a linearly extending reflector 120 oriented parallel to a long axis 125 of the receiver and fixed in position with respect to the receiver, and a linearly extending support structure 130 supporting the receiver and the reflector and pivotally mounted to accommodate rotation of the support structure, the reflector, and the receiver about a rotation axis 140 parallel to long axis 125 of the receiver. In use, the support structure, reflector, and receiver are rotated about rotation axis 140 to track the sun such that solar radiation incident on reflector 120 is concentrated onto receiver 110.

In the illustrated example, reflector 120 comprises a plurality of linearly extending reflective elements 150 (e.g., minors) oriented parallel to the long axis of the receiver and fixed in position with respect to each other and with respect to the receiver. Linear reflective elements 150 may each have a length equal or approximately equal to that of reflector 120, in which case they may be arranged side-by-side to form reflector 120. Alternatively, some or all of linear reflective elements 150 may be shorter than the length of reflector 120, in which case (e.g., as illustrated) two or more linearly extending reflective elements 150 may be arranged end-to-end to form a row along the length of the reflector, and two or more such rows may be arranged side-by-side to form reflector 120.

Linearly extending reflective elements 150 may each have a width, for example, of about 8 centimeters to about 15 centimeters, and a length, for example, of about 1.2 meters to about 3.2 meters. In some variations, some or all of reflective elements 150 have a width of about 10.7 centimeters. In some variations, some or all of reflective elements 150 have a width of about 13.2 centimeters. In some variations, some of reflective elements 150 have a width of about 10.7 centimeters and some of reflective elements 150 have a width of about 13.2 centimeters. Reflective elements 150 may be flat, substantially flat, or curved (e.g., along a direction transverse to their long axes to focus incident solar radiation).

Although in the illustrated example reflector 120 comprises linearly reflective elements 150, in other variations reflector 120 may be formed from a single continuous reflective element, from two reflective elements (e.g., one on each side of receiver 110), or in any other suitable manner.

Linear reflective elements 150, or other reflective elements used to form a reflector 120, may be or comprise, for example, any suitable front surface mirror or rear surface mirror. The reflective properties of the mirror may result, for example, from any suitable metallic or dielectric coating or polished metal surface. Some variations may utilize a mirror having a laminated structure as described later in this specification. Some other variations may utilize a rear surface minor formed with low-iron glass having a thickness of about 3 to about 4 millimeters.

In some variations, reflector 120 has a parabolic curvature transverse to its long axis. In alternative variations, reflector 120 may have any other curvature suitable for concentrating solar radiation onto a receiver.

Figure 2:
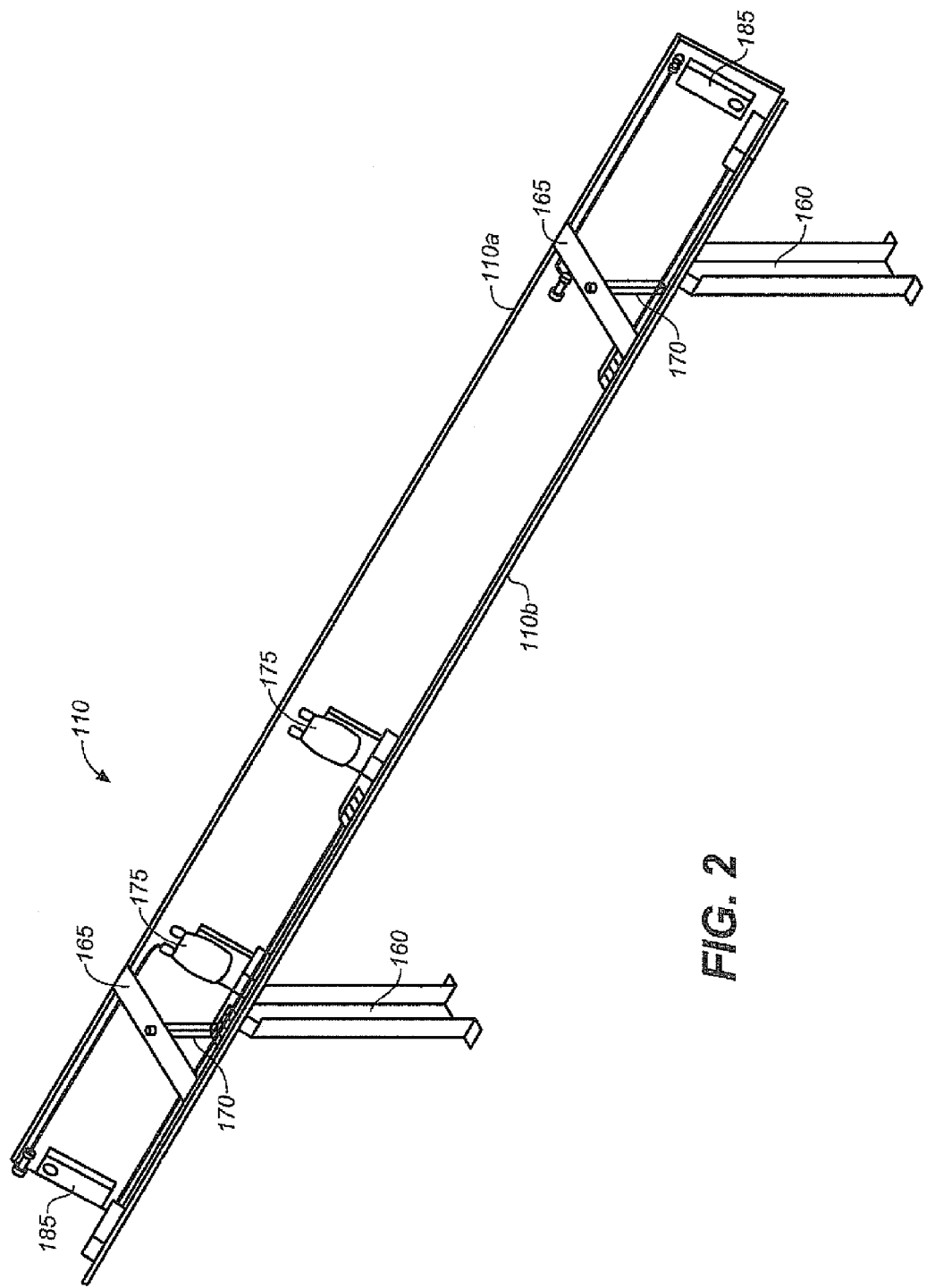
FIG. 2 shows a perspective view of an example receiver for a solar energy collector.
Figure 3A:
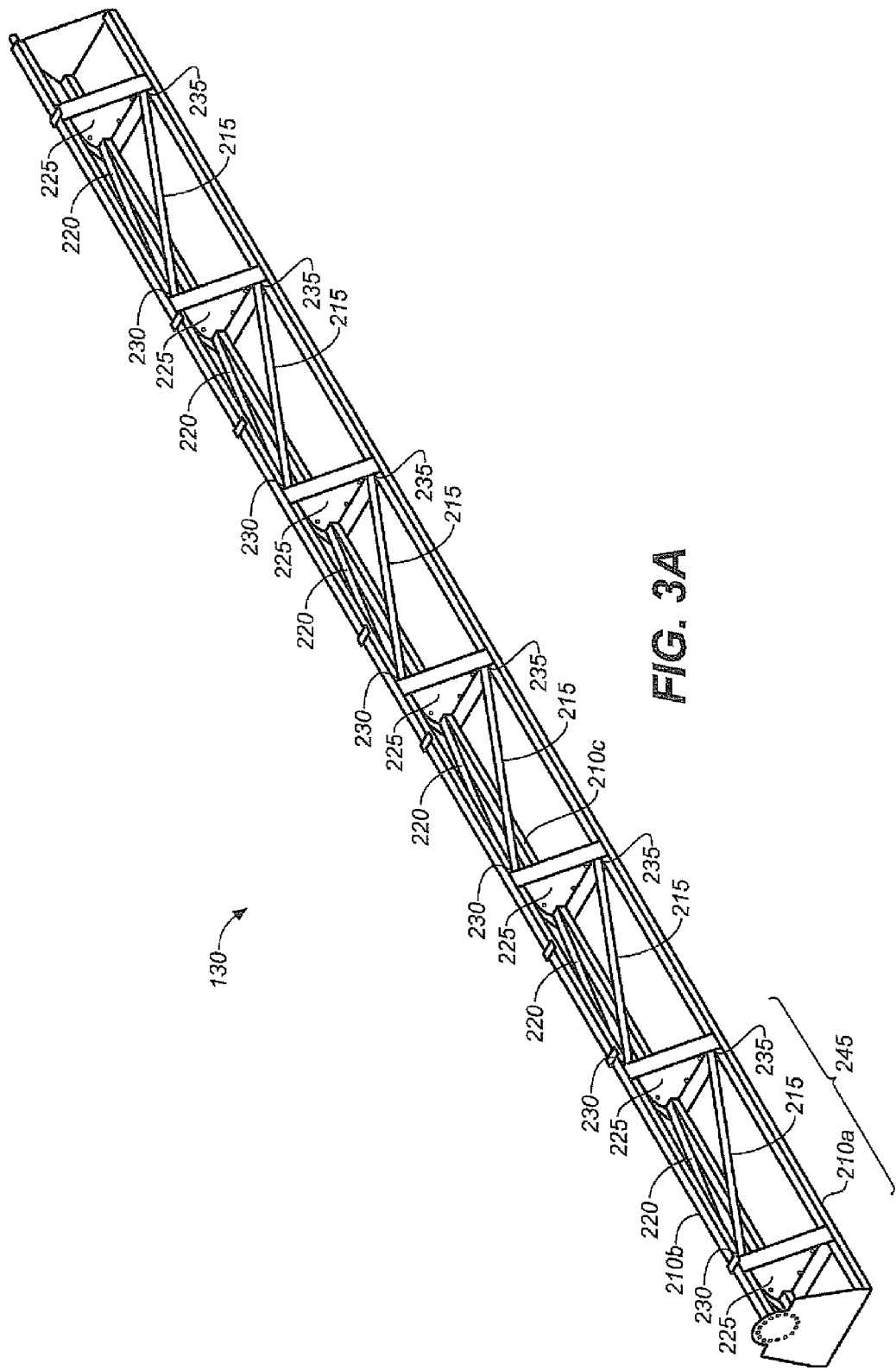

In the example illustrated in FIGS. 1A-1D as well as in FIG. 2, receiver 110 comprises two sections (e.g., individual receivers) 110a and 110b mechanically coupled to each other to form a V-shape and supported above reflector 120 by vertical supports 160. As shown in FIG. 2, the V-shaped arrangement of receiver sections 110a, 110b may optionally be stabilized by brackets 165 coupled to rods 170 attached to underlying vertical supports 160. In the illustrated example (e.g., FIG. 1A), reflective elements on one side of receiver 110 form a parabolic section of reflector 120 having a substantially linear focus on and parallel to the lower surface of receiver section 110a, and reflective elements on the other side of receiver 110 form a parabolic section of reflector 120 having a substantially linear focus on and parallel to the lower surface of receiver section 110b.

Referring again to FIGS. 1A-1D and FIG. 2, in the illustrated example lower surfaces 180a and 180b of receiver sections 110a, 110b comprise solar cells (not shown) to be illuminated by solar radiation concentrated by reflector 120. As shown in FIG. 2, junction boxes 175 or other electrical components associated with the solar cells may be located on rear surfaces of receiver sections 110a, 110b opposite to the surfaces on which solar radiation is concentrated. Liquid coolant (e.g., water, ethylene glycol, or a mixture of the two) may be introduced into and removed from receiver sections 110a, 110b, through manifolds 185 on the rear surfaces of the receiver section. Coolant introduced at one end of a receiver section may pass through one or more coolant channels (not shown) to the other end of the receiver section from which the coolant may be withdrawn. This may allow the receiver to produce electricity more efficiently (by cooling the solar cells) and to capture heat (in the coolant). Both the electricity and the captured heat may be of commercial value.

Although receiver 110 has a V-shape in the illustrated example, other variations may use other receiver geometries. Some variations may use a horizontally oriented receiver. For example, one or more receivers of the form of receiver 110a or 110b may be positioned horizontally above and parallel to reflector 120 and rotation axis 140. In use, their lower horizontal surfaces would be illuminated from below by solar radiation concentrated by reflector 120.

Although receiver sections 110a, 110b in the illustrated example comprise solar cells and coolant channels accommodating flow of liquid coolant in thermal contact with the solar cells, other arrangements may also be used. In some variations of the solar energy collector, the receiver comprises solar cells but lacks channels through which a liquid coolant may be flowed. In other variations of the solar energy collector, the receiver may comprise channels accommodating flow of a liquid to be heated by solar energy concentrated on the receiver, but lack solar cells. For example, receiver sections 110a, 110b may comprise solar cells but lack coolant channels, or lack solar cells but comprise coolant channels.

Solar energy collector 100 may comprise any suitable receiver. In addition to the illustrated examples, suitable receivers may include, for example, those disclosed in U.S. patent application Ser. No. 12/622,416, filed Nov. 19, 2009, titled "Receiver For Concentrating Photovoltaic-Thermal System;" and U.S. patent application Ser. No. 12/774,436, filed May 5, 2010, also titled "Receiver For Concentrating Photovoltaic-Thermal System;" both of which are incorporated herein by reference in their entirety.

In the illustrated example, receiver 110 is shorter than reflector 120. At one end of solar energy collector 100 (e.g., the support post 200a end), the end of receiver 110 is positioned approximately in line with the end of reflector 120. In contrast, at the other end of solar energy collector 100 (e.g., the support post 200b end), receiver 110 does not extend to the end of reflector 120. In some of such variations, the receiver is shorter than the reflector by, for example, about 2% to about 5% of the length of the reflector.

A solar energy collector having such a configuration may be oriented with its rotation axis 140 along a North-South direction, and with the end of the solar energy collector at which the receiver does not extend to the end of the reflector closer to the equator than is the other end of the solar energy collector. Because, except at the equator, solar radiation will have a daily and seasonally varying North-South component to its angle of incidence on reflector 120, portions of receiver 110 too close to the equator end of the collector would not be illuminated by concentrated solar radiation, or would be illuminated by solar radiation for a significantly shorter portion of a day, or of a year, than other portions of the receiver. That phenomenon may be avoided or diminished with the illustrated configuration. Alternatively, or in addition, in some variations receiver 110 may extend beyond the end of reflector 120 at the end of solar energy collector 100 farthest from the equator (i.e., the polar end), and hence collect concentrated solar radiation that would otherwise have missed the end of the receiver. In some of the latter variations, the receiver may be longer than the reflector by, for example, about 2% to about 5% of the length of the reflector.

In some variations, in use, a receiver is illuminated by concentrated solar radiation that under-fills the receiver. For example, more than about 80%, more than about 85%, more than about 90%, or more than about 95% of the energy of the concentrated solar radiation may be incident on the receiver in a region having a width (transverse to the long axis of the receiver) that is about 75%, about 80%, about 85%, about 90%, or about 95% of the overall width of the receiver (or of that portion of the receiver comprising solar cells). In some variations at least about 90%, or at least about 95% of the solar energy incident on the solar cells is concentrated on a central portion of the linear array of solar cells having a width, perpendicular to the long axis of the array of solar cells, of less than about 80% of the corresponding width of the linear array of solar cells. Under-filling the receiver in this manner may increase the efficiency with which concentrated solar radiation is collected and converted to useful electricity or heat.

Such under-filling may be accomplished, for example, by selecting the width of linearly extending reflective elements 150 (and their transverse curvature, if they are not flat or substantially flat) to provide the desired concentrated solar radiation intensity distribution on the illuminated receiver surface.

Referring yet again to FIGS. 1A-1D, in the illustrated example support structure 130 is pivotally mounted at its ends by slew gear 190 and bearing 195 supported by, respectively, support posts 200a and 200b. Slew gear 190 may be used to rotate receiver 110, reflector 120, and support structure 130 around rotation axis 140. Because support structure 130 is supported only at its ends (where the support posts do not obstruct rotation of receiver 110 and reflector 120), in some variations receiver 110, reflector 120, and support structure 130 may be rotated into a completely inverted position with receiver 110 and reflector 120 upside-down. In that orientation, receiver 110 and reflector 120 may be protected, or partially protected, from adverse weather conditions, for example. In some such variations, receiver 110, reflector 120, and support structure 130 may be rotated by 360 degrees or more around rotation axis 140. In addition, use of only two support posts, rather than more, may relax tolerance requirements in their placement and alignment.

Any suitable slew gear and bearing may be used in the illustrated example. Other variations may utilize any suitable alternative mounting arrangement that allows receiver 110, reflector 120, and support structure 130 to be rotated around a rotation axis parallel to a long axis of the receiver, the reflector, or (as illustrated) the receiver and the reflector to track the sun.

FIGS. 3A-3D show a portion of an example support structure 130. In that example, support structure 130 comprises three longitudinal members 210a, 210b, and 210c oriented parallel to the rotation axis, extending at least substantially the length of the reflector, and arranged to form a framework having a triangular cross-section (e.g., FIG. 3D) perpendicular to rotation axis 140.

In the illustrated example, longitudinal member 210b is coincident or substantially coincident with rotational axis 140 and located on the reflective side (e.g., the receiver side) of reflector 120. Longitudinal members 210a and 210c are located on the opposite side of reflector 120 from longitudinal member 210b. In other variations, rotational axis 140 may, for example, lie within, or outside of, the triangular cross-section of the framework formed by longitudinal members 210a-210c. In some variations, all three of longitudinal members 210a-210c may be located below reflector 120 (i.e., on the opposite side of reflector 120 from receiver 110).

The illustrated example comprises a plurality of diagonal members 215 connecting longitudinal member 210b to longitudinal member 210a, and a plurality of diagonal members 220 connecting longitudinal member 210b to longitudinal member 210c. The illustrated example also comprises a plurality of transverse plates 225. Each transverse plate 225 is oriented perpendicular to (or substantially perpendicular to) and connecting the three longitudinal members 210a-210c. Diagonals 215 each connect a joint 230 between a corresponding transverse plate 225 and longitudinal member 210b to a joint 235 between an adjacent transverse plate 225 and longitudinal member 210a. Diagonals 225 each connect a joint 230 between a corresponding transverse plate 225 and longitudinal member 210b to a joint 240 between an adjacent transverse plate 225 and longitudinal member 210c. Transverse plates 225, diagonals 215, and diagonals 220 together form a repeating pattern 245 along the length of longitudinal members 210a-210c.

Other variations of support structure 130 may include diagonal members, but lack transverse plates, or include transverse plates, but lack diagonal members. Some variations may include transverse plates and diagonals without those elements forming a repeating pattern, or with them forming a repeating pattern different from that illustrated. In some variations, each transverse plate 225 may be replaced by three transverse members, each of which connects a different pair of the longitudinal members 210a-210c.

Some variations comprise, in addition to diagonals 215, diagonals 220, and transverse plates 225 as shown in the illustrated example, longitudinal plates spanning the gap between and connecting longitudinal members 210a and 210c. In some variations, two or more such plates are positioned approximately end to end along longitudinal members 210a and 210c to close substantially all of the gap between those members. The addition of such longitudinal plates may increase the stiffness of support structure 130.

Longitudinal members 210a-210c, diagonals 215, and diagonals 220 may be formed, for example, from steel, structural steel, or aluminum beams, hollow beams, tubes, pipes, bars, rods, channel stock, angle stock, or any other suitable material in any other suitable shape. Transverse plates 225 may be formed, for example, from steel, structural steel, or aluminum plates, sheets, or any other suitable material.

Longitudinal members 210a-210c, diagonals 215, diagonals 220, and plates 225 may be attached to each other as illustrated, for example, using any suitable method. Suitable methods may include, for example, welding, gluing, or use of any suitable clamp, screw, bolt, rivet, or other mechanical fastener.

Some variations of support structure 130 do not comprise longitudinal members 210a-210c. As described later in this specification, for example, some variations may substitute a torque tube for the portion of support structure 130 shown in FIGS. 3A-3D. Any other suitable reflector support structure may also be substituted for the illustrated structure and used in combination with the other elements of the solar energy collectors disclosed herein.

As described in more detail below, support structure 130 may comprise longitudinal reflector supports each of which has a long axis oriented parallel to the rotation axis 140 and each of which supports a linearly extending reflective element 150, or a row of linearly reflective elements 150 arranged end-to-end. The linearly extending reflective element or elements may be attached, for example, to an upper surface of the longitudinal reflector support. Also as described in more detail below, support structure 130 may comprise transverse reflector supports extending away from the rotation axis 140 and supporting the longitudinal reflector supports or, alternatively, directly support mirrors or other reflective elements.

Referring now to FIGS. 4A (side view) and 4B (end or cross-sectional view), an example longitudinal reflector support 250 comprises a channel portion 255 parallel to its long axis, a first planar lip portion 260a on one side of and parallel to channel portion 255, and a second planar lip portion 260b parallel to and on an opposite side of channel portion 255 from the first lip portion 260a. Linearly extending reflective elements 150 are attached to and supported by lip portions 260a, 260b, and bridge channel portion 255, of longitudinal reflector support 250. In other variations, lip portions 260a and 260b need not be planar, as illustrated. Any suitable profile or shape for lip portions 260a, 260b may be used.

In the example illustrated in FIGS. 4A and 4B, linearly extending reflective elements 150 are attached to lip portions 260a, 260b by adhesive or glue pads 265. The adhesive or glue pads may be spaced, for example, at intervals of about 0.2 meters under the reflective elements. Any other suitable method of attaching the reflective elements to the longitudinal reflector support may be used, including adhesives or glues deployed in any other suitable manner, screws, bolts, rivets and other similar mechanical fasteners, and clamps or spring clips.

In the illustrated example, longitudinal reflector support 250 is about 11.2 meters long, channel portion 255 extends the length of longitudinal reflector support 250 and is about 10.5 centimeters wide and about 3.5 centimeters deep, and lip portions 260a and 260b extend the length of longitudinal reflector support 250 and are about 2.0 centimeters wide. Linearly extending reflective elements 150 are about 10.7 centimeters wide in this example. Two or more longitudinally reflective elements are attached end-to-end along a longitudinal reflector support with a spacing of about 1 millimeter between reflective elements. In other variations, such longitudinal reflector supports may be, for example, about 6.0 meters to about 12.0 meters long, channel portions 255 may be about 8 centimeters to about 15 centimeters wide and about 2.0 centimeters to about 8.0 centimeters deep, and lip portions 260a, 260b may be about 1.0 centimeters to about 4.0 centimeters wide.

Referring now to FIG. 4C, in another example a longitudinal reflector support 265 is substantially similar to longitudinal reflector support 250 just described, except that longitudinal reflector support 265 further comprises slot portions 270a, 270b at the ends of lip portions 260a, 260b. In this example, linearly extending reflective elements 150 may be loaded onto longitudinal support 265 by sliding the reflective elements in from the end of the reflector support. Slot portions 270a, 270b help maintain linearly extending reflective elements 150 in position. Adhesives, glues, clamps, or mechanical fasteners, for example, may be used to further secure the reflective elements to the reflector supports.

In the illustrated examples, the longitudinal reflector supports are trough shaped with a cross section having a flat-bottomed "U" shape. In other variations, the longitudinal reflector supports may be trough shaped with, for example, a rounded bottom "U" shape cross-section, a "V" shape cross-section, or an upside-down Ω (Greek letter Omega) cross-section. In other variations, the longitudinal reflector support may comprise multiple channel portions (e.g., 2, 3, or more than 3), side-by-side in parallel, between lip portions 260a, 260b. In such variations, the longitudinal reflector support may have, for example, a W shaped cross section or a cross-section that may be viewed as composed of multiple V or U shapes side-by-side.

In the illustrated example, individual longitudinal reflector supports extend the length of the reflector. In other variations, some or all of the longitudinal reflector supports may be shorter than the overall length of the reflector, in which case two or more longitudinal reflector supports may be arranged end-to-end to form a row along the length of the reflector.

Longitudinal reflector supports may be formed, in some variations, from sheet steel, sheet aluminum, or other sheet metals. In some variations (such as those illustrated in FIGS. 4A-4C, for example), the lips and channel portion (and slot portions, if present) of a longitudinal reflector support may be rolled, folded, or otherwise formed from a continuous piece of sheet metal. In some variations, the lips and channel portion of a longitudinal reflector support as illustrated are formed from a continuous sheet of steel having a thickness of about 1 millimeter.

As noted above, support structure 130 may comprise a plurality of transverse reflector supports that extend away from the rotational axis 140 and directly support mirrors or other reflective elements or, alternatively, support mirrors or reflective elements via longitudinal reflector supports as disclosed herein or via any other suitable additional reflector support structure. Such transverse reflector supports, designated by reference numeral 275, are partially visible in FIGS. 1A-1C.

Figure 5:
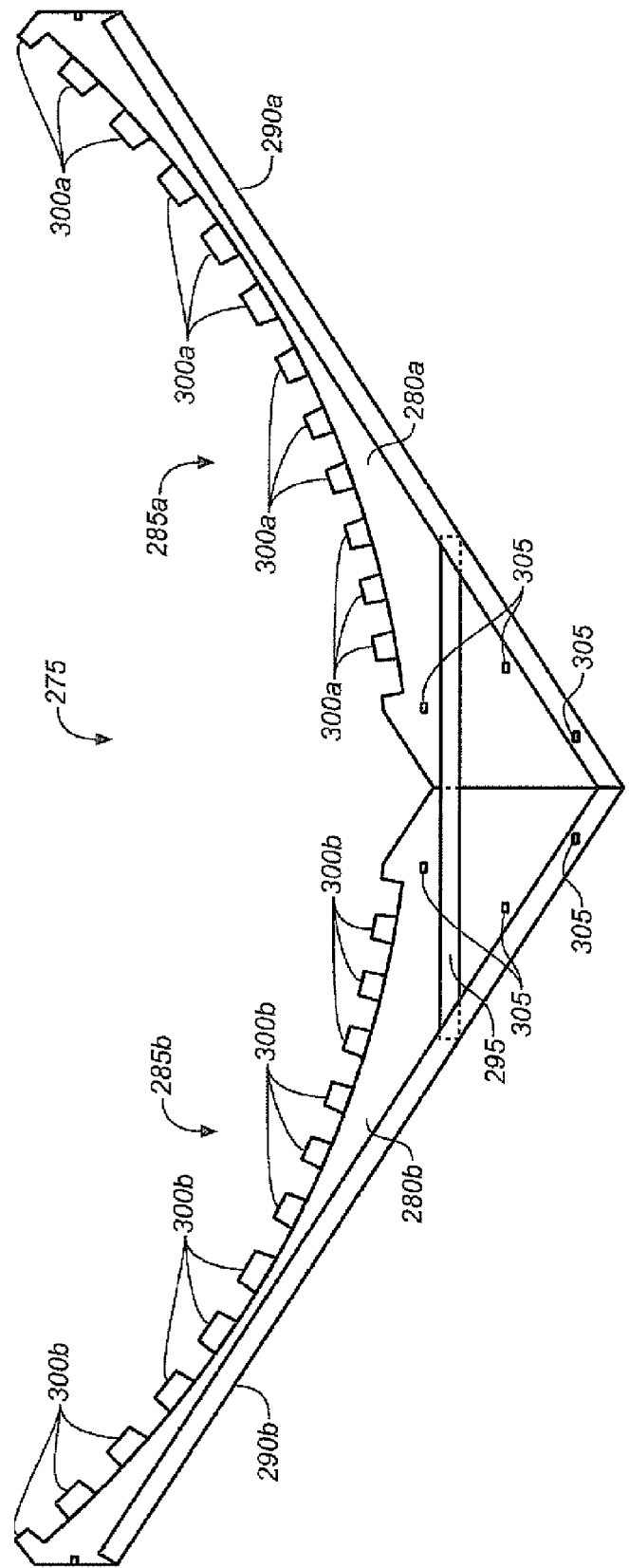
FIG. 5 shows an example transverse reflector support.

Referring now to FIG. 5, an example transverse reflector support 275 comprises two (e.g., symmetrical) plates 280a, 280b, each of which has, respectively, an upper notched edge 285a, 285b. Optionally, plates 280a, 280b are folded along edges 290a, 290b to form an upward-facing u-shape channel section running parallel to those edges. In the illustrated example, transverse reflector support 275 also comprises an optional cross member 295 partially inserted (as shown by dashed lines) into lower channel sections of plates 280a, 280b and coupling those plates to each other. Portions of surfaces 300a and 300b adjacent to the notches in plates 280a, 280b may be cut to define desired orientations of linearly extending reflective elements to be supported by the transverse reflector support.

Transverse plates 280a, 280b of transverse reflector supports 275 may be formed, for example, from continuous metal (e.g., steel, aluminum) sheets or plates into which the notches are cut.

In the illustrated example, transverse reflector supports 275 may be attached to corresponding ones of transverse plates 225 (FIG. 3A), for example, by welding, gluing, or use of any suitable clamp, screw, bolt, rivet or other mechanical fastener. Such fasteners may use holes 305 in plates 280a, 280b (FIG. 5) for example.

In the example illustrated in the various figures, support structure 130 (FIGS. 1A-1C) comprises a plurality of transverse reflector supports 275. Each notch in an upper surface of a transverse reflector support 275 (FIG. 5) corresponds to a separate longitudinal reflector support 250 or 265 (FIG. 4). Each notch in a transverse reflector support 275 is aligned with a similarly or identically placed notch (corresponding to the same longitudinal reflector support) in the other transverse reflector supports. The channel portions 255 of the longitudinal reflector supports are positioned in corresponding notches of the transverse reflector supports. The lip portions 260a, 260b of the longitudinal reflector supports are then in contact with and supported by portions of surfaces 300 of the transverse reflector supports adjacent to the corresponding notches. Surfaces 300 may orient the longitudinal reflector supports, and thus the linearly extending reflective elements 150 they support, in a desired orientation with respect to receiver 110 with a precision of about 0.5 degrees, for example, or better (i.e., tolerance less than about 0.5 degrees). In other variations, this tolerance may be, for example, greater than about 0.5 degrees.

Longitudinal reflector supports 250 or 265 may be attached to transverse reflector supports 275 or to other portions of support structure 130, for example, by welding, gluing, or use of any suitable clamp, screw, bolt, rivet or other mechanical fastener. In some variations, the longitudinal reflector supports are clamped at their ends (e.g., only at their ends) to another portion of support structure 130.

Although particular examples of longitudinal reflector supports and transverse reflector supports are illustrated and described herein, any other suitable reflector supports or reflector structures may be used in combination with the other elements of the solar energy collectors disclosed herein.

As noted above, in some variations reflector 120 (FIG. 1A) comprises linear reflective elements arranged end-to-end in rows (e.g., of equal length) along the length of the reflector, with two or more such rows arranged side-by side. In such variations, the linear reflective elements may be of two or more different lengths and arranged such that gaps or joints between the reflective elements in one row are not next to gaps or joints between reflective elements in an adjacent row. In some variations, no gaps or joints between reflective elements in any row are next to gaps or joints between reflective elements in any adjacent row. In some variations, the majority of gaps or joints between reflective elements in any row are not adjacent to gaps or joints between reflective elements in any adjacent row.

In the example of FIG. 6A, a reflector 120 comprises two different lengths of linearly extending reflective elements, as exemplified by reflective elements 150a and 150b. In the arrangement of linearly extending reflective elements in this example, each gap or joint (e.g., 310a) is separated from the next nearest gap or joint (e.g., 310b) in the direction transverse to the long axis of reflector 120 by at least one row of linearly extending reflective elements.

In the example of FIG. 6B, a reflector 120 comprises three different lengths of linearly extending reflective elements, as exemplified by reflective elements 150c, 150d, and 150e. In the arrangement of linearly extending reflective elements in this example, each gap or joint (e.g., 310c) is separated from the next nearest gap or joint (e.g., 310d) in the direction transverse to the long axis of reflector 120 by at least two rows of linearly extending reflective elements.

Linearly extending reflective elements may be arranged in a manner substantially similar to the examples of FIGS. 6A and 6B, using a larger number of different lengths of reflective elements, to construct reflectors having a correspondingly larger number of rows between gaps.

Arrangements such as those just described may produce a more uniform illumination of the receiver by concentrated solar radiation than would occur if gaps or joints between reflective elements in rows were generally next to gaps or joints in adjacent rows, because such adjacent gaps or joints might cast shadows that were superimposed on each other on the receiver.

Figure 7A:
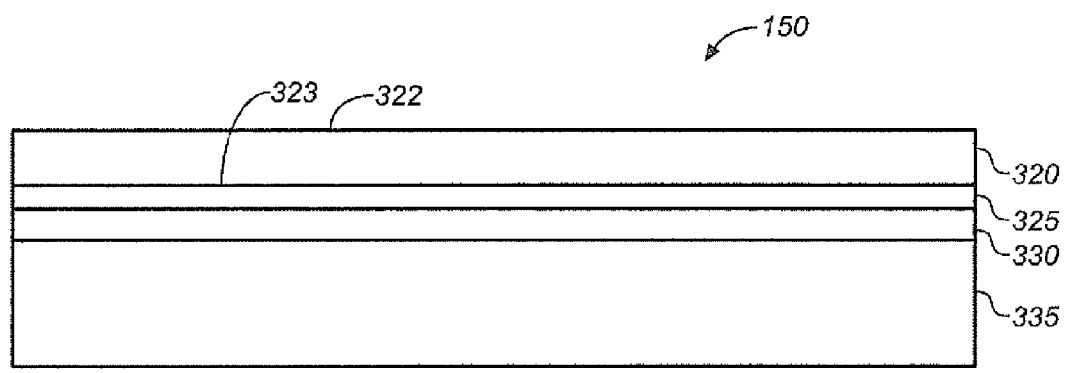
FIGS. 7A and 7B show example reflective elements (e.g., mirrors) having laminated structures.

Also as noted above, in some variations linearly extending reflective elements 150 have a laminated structure. Referring to FIG. 7A, in the illustrated example reflective element 150 comprises a low-iron glass layer 320 having a first surface 322 and a second surface 323. When in use in a solar energy collector as disclosed herein, reflective element 150 is oriented so that surface 322 faces the receiver (and hence the incident solar radiation). A reflective layer 325 is disposed on the second surface of the low-iron glass layer. An adhesive layer 330 is disposed on the reflective layer. A second glass layer 335 is attached by adhesive layer 330 to reflective layer 325.

Figure 7B:
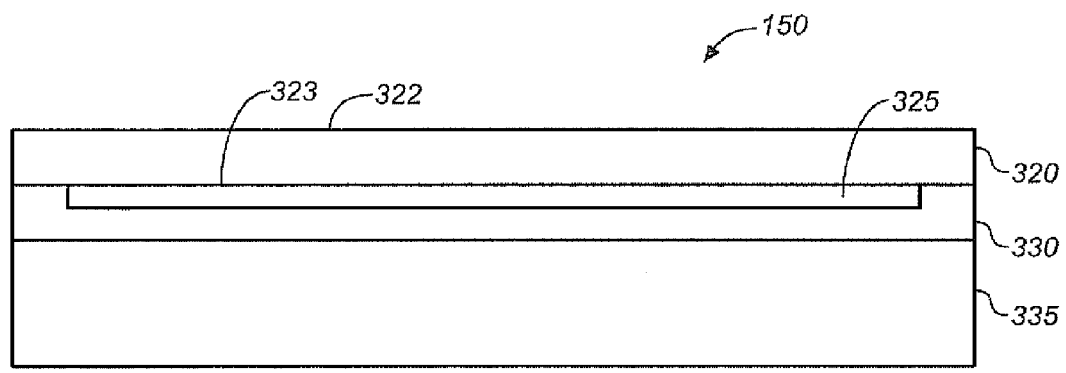

In the example illustrated in FIG. 7B, reflective layer 325 is absent from edge portions (e.g., around the entire periphery of reflective element 150) of the second surface 323 of low-iron glass layer 320. Adhesive layer 330 attaches corresponding edge portions (e.g., around the entire periphery of reflective element 150) of second glass layer 335 directly to the exposed edge portions of surface 323, and attaches other portions of second glass layer 335 to reflective layer 325. In this example, adhesive layer 330, in combination with glass layers 320 and 335, may seal and/or protect reflective layer 325 from the external environment.

Low-iron glass layer may be, for example, about 0.5 millimeters to about 3 millimeters thick. Reflective layer 325 may comprise, for example, silver, gold, chrome, or any other suitable metal or non-metal material or materials and be, for example, about 20 nanometers to about 200 nanometers thick. Adhesive layer 325 may comprise, for example, an acrylic closed-cell foam adhesive tape (e.g., VHB™ tape available from 3M™), and be, for example, about 0.5 millimeters to about 1.5 millimeters thick. Second glass layer 335 may comprise, for example, soda lime glass or borosilicate glass and be, for example, about 2 millimeters to about 5 millimeters thick. In one example, low-iron glass layer 320 is about 1 millimeter thick, reflective layer 325 comprises silver and is about 80 nanometers thick, adhesive layer 330 comprises acrylic closed-cell foam tape and is about 0.9 millimeters thick, and second glass layer 335 comprises soda lime glass and is about 4 millimeters thick.

Reflective layer 325 may be deposited and patterned (e.g., its edges removed), and adhesive layer 330 deposited, by conventional processes, for example.

Figure 8:
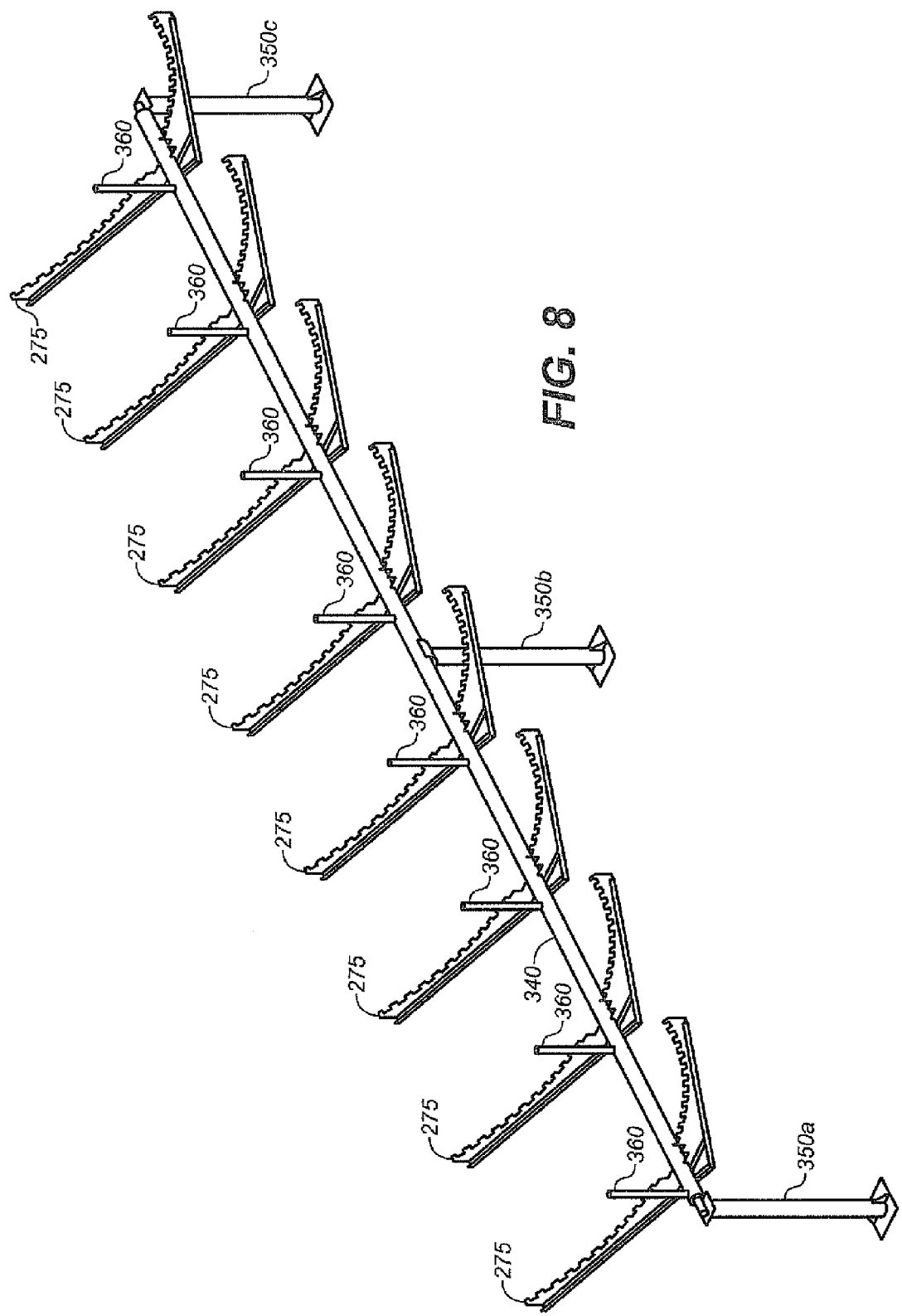
FIG. 8 shows an example pivotally mounted support structure comprising a torque tube and transverse reflector supports.

As noted above, some variations of the solar energy collectors disclosed herein may substitute a torque tube for the portion of support structure 130 shown in FIGS. 3A-3D. In the example of FIG. 8, a torque tube 340 is pivotally supported by support posts 350a, 350b, and 350c. Transverse reflector supports 275, which may be substantially similar to those described above, are attached to torque tube 340. Longitudinal reflector supports 250 or 265, as described above, with attached linearly extending reflective elements 150, may be installed on transverse reflector supports 275 to provide a reflector 120 identical or substantially similar to those described above. A receiver, substantially similar to those described above, may be supported by vertical supports 160 above the reflector.

Figure 9A:
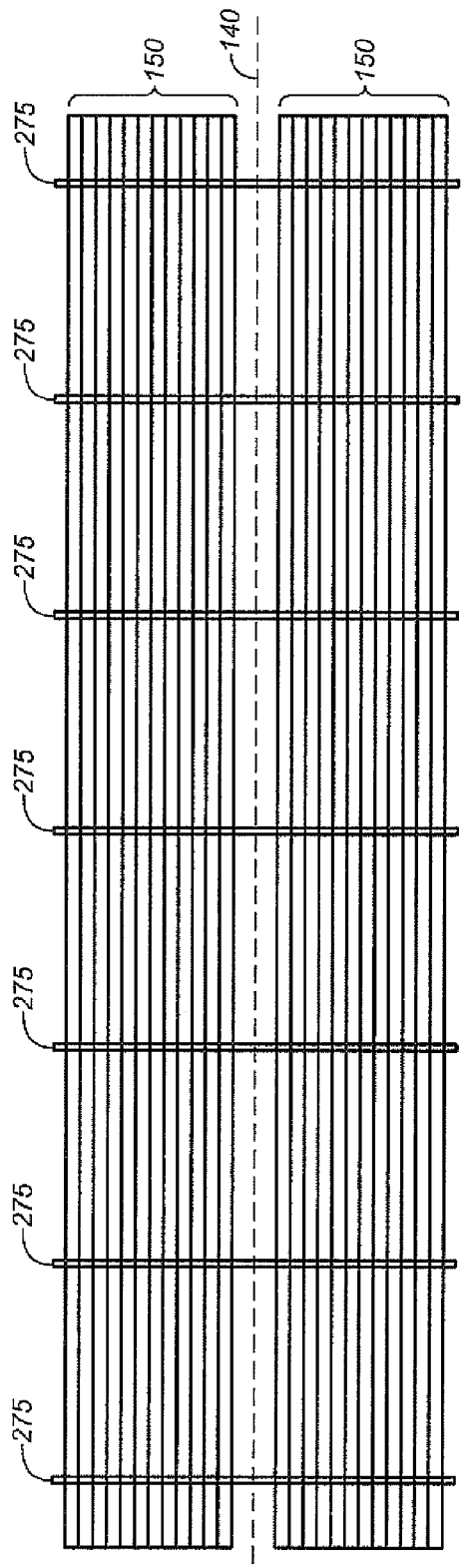
FIG. 9A shows a plan view of an example solar energy collector comprising transverse reflector supports oriented substantially perpendicular to the rotation axis.

FIG. 9A shows a plan view of an example solar energy collector 100 comprising rows of linearly extending reflective elements 150 supported by transverse reflector supports 275 that are oriented substantially perpendicular to rotation axis 140. If linearly extending reflective elements 150 and any underlying longitudinal support are insufficiently stiff, the rows of reflective elements 150 may droop (i.e., sag) between transverse reflector supports 275. This drooping may cause non-uniformity in the intensity distribution of solar radiation concentrated by the reflective elements on a receiver. Because the transverse reflector supports 275 are oriented perpendicular to the rows of reflective elements 150, the drooping may occur at similar or the same locations along the different rows of reflective elements, which may increase the non-uniformity of the concentrated solar radiation intensity distribution at the receiver.

Figure 9B:
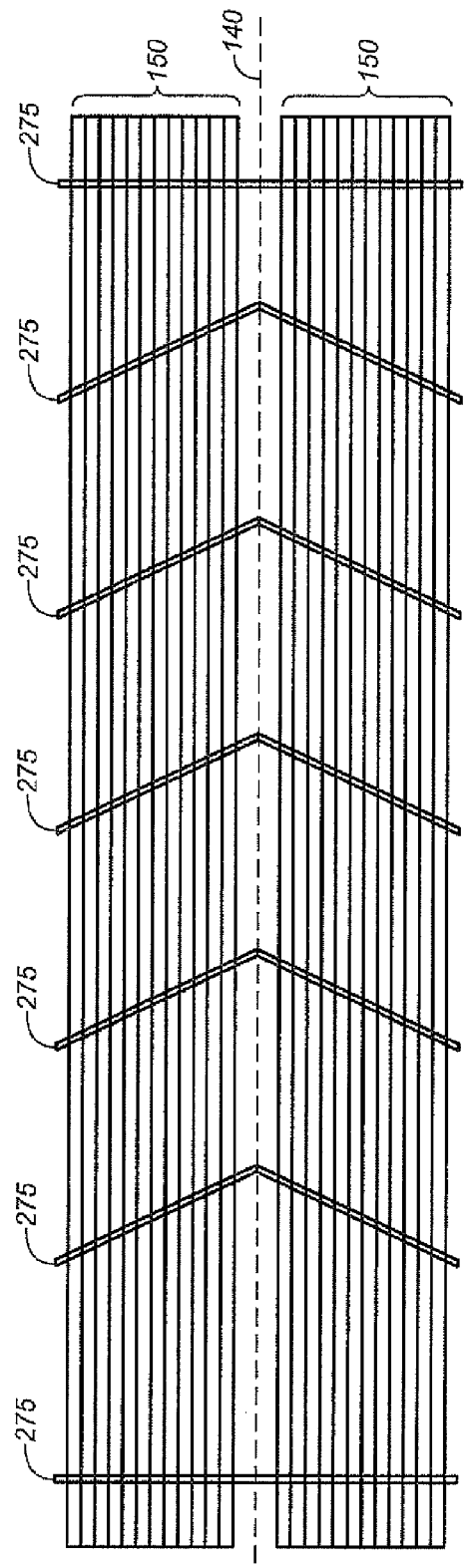
FIG. 9B shows a plan view of an example solar energy collector comprising transverse reflector supports at least some of which are not oriented perpendicular to the rotation axis.

Referring now to the plan view of FIG. 9B, in other variations some or all of transverse reflector supports 275 are oriented at an angle with respect to the rotation axis other than 90°. FIG. 9B shows only a single example of the many such possible configurations. In such arrangements, any drooping of the rows of reflective elements 150 will likely occur at different locations along each row, diminishing any resulting non-uniformity of the concentrated solar radiation intensity distribution at the receiver.

Figure 10A:
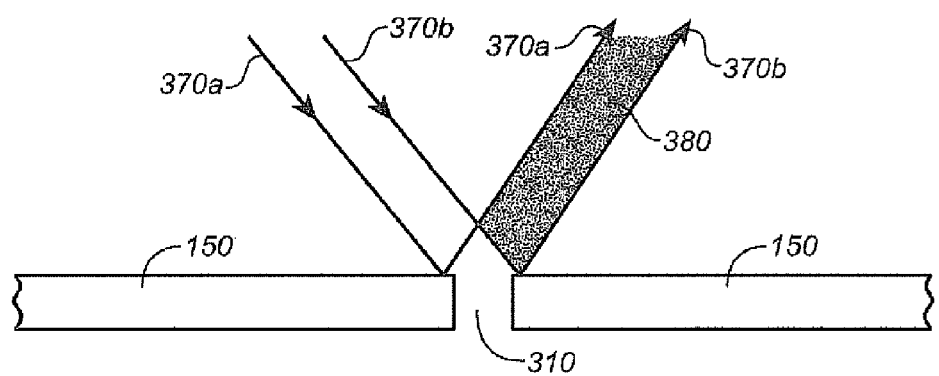
FIGS. 10A-10C show example geometries of reflective elements arranged end-to-end in a reflector near gaps between the reflective elements.

As noted above, gaps between reflective elements in a solar energy collector may cause shadows that produce non-uniform illumination of the receiver. Referring to FIG. 10A, for example, light rays 370a, 370b incident on ends of reflective elements 150 adjacent to gap 310 are reflected in parallel and hence cast a shadow 380 because no light is reflected from gap 310.

Figure 10B:
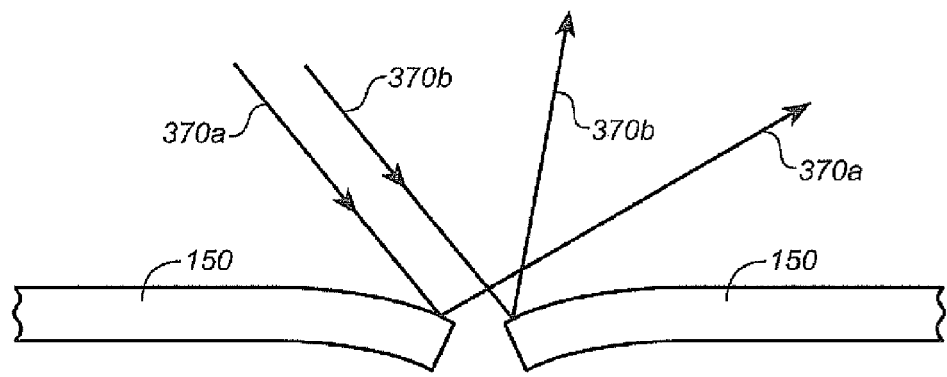
Figure 10C:
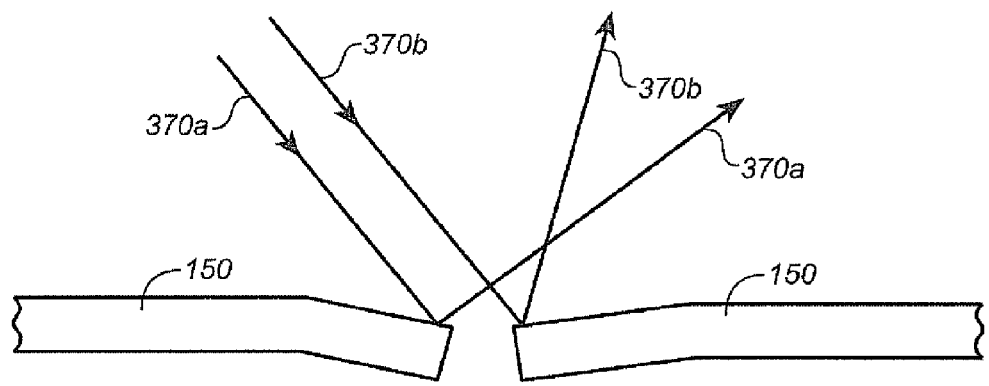

In some variations, such shadows may be attenuated or blurred by shaping the ends of reflective elements 150 adjacent the gap to spread reflected light into what would otherwise be a shadow. Referring to FIGS. 10B and 10C, for example, ends of reflective elements 150 adjacent the gap may curve or bend downward into gap 310 (i.e., away from the incident light). In such variations, light rays 370a, 370b are reflected in a crossing manner that spreads reflected light into what would otherwise be a shadow 380 (FIG. 10A). Such shaping of the ends of reflective elements 150 may be accomplished, for example, by positioning underlying support structure such that the force of gravity draws the ends of the reflective elements into the desired shape. Alternatively, linear reflective elements 150 may be attached to underlying support structure that applies a force to induce such a shape, or linear reflective elements 150 may be formed to inherently have such a shape. Any suitable manner of shaping the ends of reflective elements 150 to attenuate shadows cast by gaps between the reflective elements may be used.

Figure 11B:
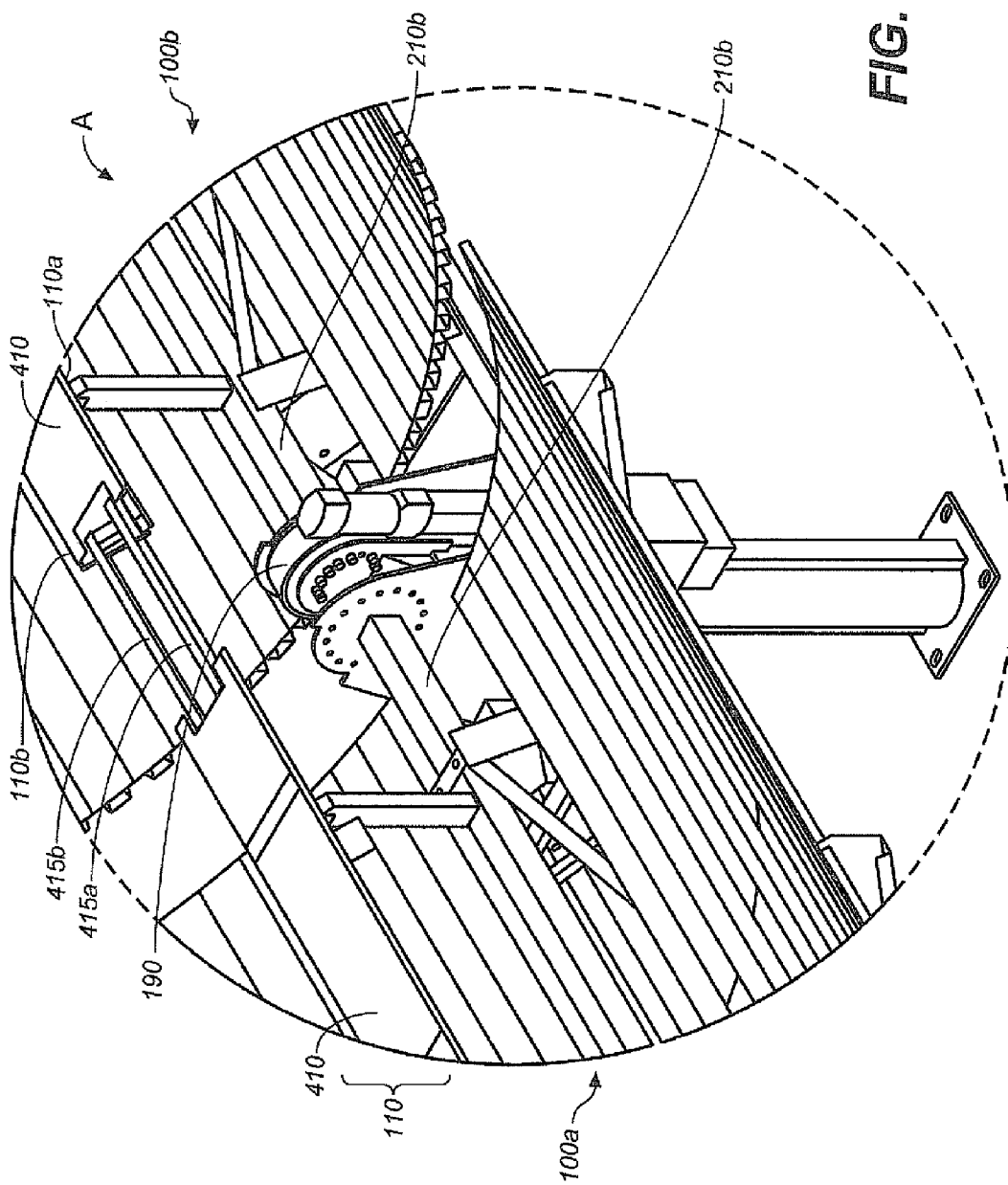
FIG. 11B shows an expanded view of a detail of the example system shown in FIG. 11A.

Two or more solar energy collectors as disclosed herein may be electrically, fluidly, and/or mechanically coupled to each other and may, for example, share a drive mechanism. Referring now to FIGS. 11A and 11B, for example, two aligned solar energy collectors 100a, 100b may share, and be driven by, a single slew gear 190. Solar energy collectors 100a, 100b may be substantially similar to any of the solar energy collectors disclosed herein.

In the example illustrated in FIGS. 11A and 11B, conduit 415a fluidly couples receiver section 110a of solar energy collector 100b to the corresponding receiver section in solar energy collector 100a, and conduit 415b similarly fluidly couples receiver section 110b in solar energy collector 100b to the corresponding receiver section in solar energy collector 100a. Conduits 415a, 415b allow coolant from one solar energy collector to be transferred to the other for further heating, for example.

In the illustrated example, conduits 415a and 415b are straight connections between the adjacent solar energy collectors, with the conduits located at approximately the positions of the linear foci of the reflectors in the solar energy collectors. In such variations, concentrated solar radiation may be incident on and absorbed by conduits 415a, 415b. In some such variations, solar energy collectors 100a, 100b are configured and oriented (e.g., with rotation axis oriented North-South) such that, over time (e.g., during the course of a day or a year), solar radiation concentrated by reflectors in the solar energy collectors walks onto or off of the conduits. This can occur, for example, as the angle of the sun above the horizon varies during the course of a day or a year and the linear foci of reflectors oriented in a North-South direction move along a North-South axis. In some variations, conduits 415a, 415b may receive greater concentrated solar radiation during the winter than during the summer. In some variations, as the angle of the sun above the horizon decreases (e.g., during the course of a day or a year), concentrated solar radiation walks off conduits 415a, 415b onto an adjacent end of a receiver.

In some variations, conduits 415a, 415b are glazed, e.g., enclosed in a substantially transparent outer tube or shell (not shown), with an optional air gap between the conduit and the outer tube or shell. Such a tube or shell may be formed, for example, from glass or plastic. Glazing the conduits may enhance retention of heat in coolant flowing through the conduits, and may also provide for further collection of heat from solar radiation incident on the conduits. In some variations in which the conduits are glazed, the conduits are coated, painted (e.g., with black paint) or otherwise treated to increase absorption of solar radiation. Such treating, coating, or painting of the conduits to increase absorption of solar radiation may also be utilized in variations in which the conduits are not glazed.

In some variations, conduits 415a, 415b are insulated to enhance retention of heat. Any suitable insulation may be used.

Use of conduits such as 415a and 415b, whether straight or otherwise, is optional.

In the example of FIGS. 11A and 11B, each receiver 110 comprises receiver sections 110a, 110b mechanically coupled to form a V-shape. Each receiver 110 also comprises a cover 410 extending parallel to the rotation axis and positioned horizontally above receiver sections 110a, 110b. Cover 410 may close and (optionally) seal the top of the V-shape. Similar or identical covers may be utilized with other solar energy collectors disclosed herein, as well, particularly with any of the solar energy collectors disclosed herein comprising V-shaped receivers. The use of such covers, or of additional solar energy receiver sections in their place, is further described in U.S. patent application Ser. No. 12/774,436, filed May 5, 2010, titled "Receiver For Concentrating Photovoltaic-Thermal System."

This disclosure is illustrative and not limiting. Further modifications will be apparent to one skilled in the art in light of this disclosure and are intended to fall within the scope of the appended claims.

What is claimed is:

1. A concentrating solar energy collector comprising:
   a linearly extending receiver comprising solar cells;
   a plurality of linearly extending reflective elements arranged in side-by-side rows, oriented parallel to a long axis of the receiver, and fixed in position with respect to each other and with respect to the receiver to form a linearly extending reflector; and
   a linearly extending support structure supporting the receiver and the reflector and pivotally mounted to accommodate rotation of the support structure, the reflector, and the receiver about a rotation axis parallel to the long axis of the receiver;
   wherein ends of the linearly extending reflective elements are bent away from the receiver to spread light along the long axis of the receiver and into shadows that would otherwise be cast on the receiver by gaps between linearly extending reflective elements.

2. The concentrating solar energy collector of claim 1, wherein the receiver comprises a lower surface oriented horizontally above the reflector to receive solar radiation concentrated by the reflector.

3. The concentrating solar energy collector of claim 1, where the receiver comprises first and second lower surfaces arranged to form a V-shape above the reflector, with a section of the reflector on one side of the receiver arranged to focus solar radiation onto the first surface and a section of the reflector on the other side of the receiver arranged to focus solar radiation onto the second surface.

4. The concentrating solar energy collector of claim 1, wherein the receiver comprises coolant channels accommodating flow of liquid coolant in thermal contact with the solar cells.

5. The concentrating solar energy collector of claim 1, wherein the linearly extending reflective elements are flat or substantially flat transverse to their long axes.

6. The concentrating solar energy collector of claim 1, wherein the linearly extending reflective elements are of at least two different lengths, and each row includes two or more of the linearly extending reflective elements arranged end-to-end such that gaps or joints between the reflective elements in one row are not next to gaps or joints between reflective elements in an adjacent row.

7. The concentrating solar energy collector of claim 1, wherein the linearly extending reflective elements are curved transverse to their long axes.

8. The concentrating solar energy collector of claim 1, wherein the reflector has a parabolic curvature transverse to its long axis.

9. The concentrating solar energy collector of claim 1, wherein:
   the receiver comprises a lower surface oriented horizontally above the reflector to receive solar radiation concentrated by the reflector;
   the linearly extending reflective elements are flat or substantially flat transverse to their long axes; and
   the reflector has a parabolic curvature transverse to its long axis.

10. The concentrating solar energy collector of claim 9, wherein the receiver comprises coolant channels accommodating flow of liquid coolant in thermal contact with the solar cells.

11. The concentrating solar energy collector of claim 1, wherein each row includes two or more of the linearly extending reflective elements arranged end-to-end such that gaps or joints between the reflective elements in one row are not next to gaps or joints between reflective elements in an adjacent row, and each gap or joint is separated from its nearest neighbor gap or joint in a direction transverse to the long axis of the receiver by at least one row of linearly extending reflective elements.

12. The concentrating solar energy collector of claim 11, wherein the receiver comprises a lower surface oriented horizontally above the reflector to receive solar radiation concentrated by the reflector.

13. The concentrating solar energy collector of claim 11, where the receiver comprises first and second lower surfaces arranged to form a V-shape above the reflector, with a section of the reflector on one side of the receiver arranged to focus solar radiation onto the first surface and a section of the reflector on the other side of the receiver arranged to focus solar radiation onto the second surface.

14. The concentrating solar energy collector of claim 11, wherein the receiver comprises coolant channels accommodating flow of liquid coolant in thermal contact with the solar cells.

15. The concentrating solar energy collector of claim 11, wherein the linearly extending reflective elements are flat or substantially flat transverse to their long axes.

16. The concentrating solar energy collector of claim 11, wherein the linearly extending reflective elements are of at least two different lengths.

17. The concentrating solar energy collector of claim 11, wherein each gap or joint is separated from its nearest neighbor gap or joint in a direction transverse to the long axis of the receiver by at least two rows of linearly extending reflective elements.

18. The concentrating solar energy collector of claim 11, wherein the linearly extending reflective elements are curved transverse to their long axes.

19. The concentrating solar energy collector of claim 11, wherein the reflector has a parabolic curvature transverse to its long axis.

20. The concentrating solar energy collector of claim 11, wherein:
   the receiver comprises a lower surface oriented horizontally above the reflector to receive solar radiation concentrated by the reflector;
   the linearly extending reflective elements are flat or substantially flat transverse to their long axes; and
   the reflector has a parabolic curvature transverse to its long axis.

21. The concentrating solar energy collector of claim 20, wherein the receiver comprises coolant channels accommodating flow of liquid coolant in thermal contact with the solar cells.

22. The concentrating solar energy collector of claim 20, wherein the linearly extending reflective elements are of at least two different lengths.

23. The concentrating solar energy collector of claim 20, wherein each gap or joint is separated from its nearest neighbor gap or joint in a direction transverse to the long axis of the receiver by at least two rows of linearly extending reflective elements.

* * * * *